(12) United States Patent
Maekawa

(10) Patent No.: US 7,332,431 B2
(45) Date of Patent: Feb. 19, 2008

(54) METHOD OF MANUFACTURING SEMICONDUCTOR DEVICE

(75) Inventor: Shinji Maekawa, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 445 days.

(21) Appl. No.: 10/685,380

(22) Filed: Oct. 16, 2003

(65) Prior Publication Data
US 2004/0087156 A1 May 6, 2004

(30) Foreign Application Priority Data
Oct. 17, 2002 (JP) .............................. 2002-303659

(51) Int. Cl.
*H01L 21/00* (2006.01)
(52) U.S. Cl. ...................... 438/674; 438/166; 438/149
(58) Field of Classification Search ................ 438/149, 438/166, 649
See application file for complete search history.

(56) References Cited

U.S. PATENT DOCUMENTS

| | | | |
|---|---|---|---|
| 4,659,422 A | 4/1987 | Sakurai | |
| 5,543,352 A | 8/1996 | Ohtani et al. | |
| 5,612,250 A | 3/1997 | Ohtani et al. | |
| 5,612,251 A * | 3/1997 | Lee ............................. | 438/795 |
| 5,643,826 A | 7/1997 | Ohtani et al. | |
| 5,767,003 A | 6/1998 | Noguchi | |
| 5,923,962 A | 7/1999 | Ohtani et al. | |
| 5,953,597 A | 9/1999 | Kusumoto et al. | |
| 6,020,224 A | 2/2000 | Shimogaichi et al. | |
| 6,072,194 A * | 6/2000 | Wakita et al. ................ | 257/66 |
| 6,246,524 B1 | 6/2001 | Tanaka | |
| 6,248,606 B1 | 6/2001 | Ino et al. | |
| 6,322,625 B2 | 11/2001 | Im | |
| 6,380,009 B1 | 4/2002 | Battersby | |

(Continued)

FOREIGN PATENT DOCUMENTS

EP 0 651 431 A2 5/1995

(Continued)

OTHER PUBLICATIONS

Kazuhiro Shimizu et al., "High-Mobility Poly-Si Thin-Film Transistors Fabricated by a Novel Excimer Laser Crystallization Method", IEEE Transactions on Electron Devices., vol. 40, No. 1, pp. 112-117.

(Continued)

*Primary Examiner*—Steven Loke
*Assistant Examiner*—David Goodwin
(74) *Attorney, Agent, or Firm*—Nixon Peabody LLP; Jeffrey L. Costellia

(57) ABSTRACT

In a semiconductor device having a semiconductor film crystallized by using a metal element, it is an object to provide a technique for reducing the crystal defects in a semiconductor film, and a technique for forming a semiconductor film with high crystallinity by effectively removing impurity metal elements.

An amorphous semiconductor film is formed over a transparent substrate; the amorphous semiconductor film is crystallized by using metal elements; a crystalline semiconductor film is irradiated with a first laser beam in a direction from the semiconductor film to the substrate, thereby partly melted and crystallized; and the semiconductor film is irradiated with a second laser beam through the substrate in a direction from the substrate film to the semiconductor film.

73 Claims, 11 Drawing Sheets

U.S. PATENT DOCUMENTS

| | | |
|---|---|---|
| 6,399,959 B1 * | 6/2002 | Chang et al. ............... 257/57 |
| 6,423,585 B1 * | 7/2002 | Yamazaki et al. .......... 438/166 |
| 6,426,245 B1 | 7/2002 | Kawasaki et al. |
| 6,451,631 B1 * | 9/2002 | Grigoropoulos et al. .... 438/149 |
| 6,475,839 B2 | 11/2002 | Zhang et al. |
| 6,548,370 B1 | 4/2003 | Kasahara et al. |
| 6,599,788 B1 | 7/2003 | Kawasaki et al. |
| 6,645,454 B2 * | 11/2003 | Voutsas ...................... 423/348 |
| 6,730,550 B1 | 5/2004 | Yamazaki et al. |
| 6,743,700 B2 | 6/2004 | Asami et al. |
| 6,746,942 B2 * | 6/2004 | Sato et al. .................. 438/586 |
| 6,803,296 B2 | 10/2004 | Miyairi |
| 6,821,828 B2 | 11/2004 | Ichijo et al. |
| 6,884,699 B1 * | 4/2005 | Ogawa et al. .............. 438/489 |
| 6,913,956 B2 | 7/2005 | Hamada et al. |
| 6,927,109 B1 * | 8/2005 | Tanaka et al. .............. 438/166 |
| 6,991,997 B2 | 1/2006 | Takayama et al. |
| 7,052,943 B2 | 5/2006 | Yamazaki et al. |
| 7,115,453 B2 | 10/2006 | Nakamura et al. |
| 7,122,450 B2 | 10/2006 | Yamazaki et al. |
| 2001/0052950 A1 | 12/2001 | Yamazaki et al. |
| 2002/0146874 A1 | 10/2002 | Kawasaki et al. |
| 2002/0151115 A1 * | 10/2002 | Nakajima et al. ........... 438/149 |
| 2002/0151120 A1 | 10/2002 | Yamazaki et al. |
| 2003/0003636 A1 * | 1/2003 | Grigoropoulos et al. .... 438/149 |
| 2006/0019474 A1 * | 1/2006 | Inui et al. ................... 438/487 |

FOREIGN PATENT DOCUMENTS

| | | |
|---|---|---|
| JP | 07-130652 | 5/1995 |
| JP | 07-161634 | 6/1995 |
| JP | 08/228006 | 9/1996 |
| JP | 2001-85703 | 3/2001 |
| JP | 2001-345453 | 12/2001 |

OTHER PUBLICATIONS

Kazuhiro Shimizu et al., "High-Mobility Poly-Si Thin-Film Transistors Fabricated by a Novel Excimer Laser Crystallization Method", IEEE Transactions on Electron Devices., vol. 40, No. 1, 1993, pp. 112-117.

* cited by examiner

METHOD OF MANUFACTURING SEMICONDUCTOR DEVICE

BACKGROUND OF THE INVENTION

1. Field of the Invention

The present invention relates to a method of manufacturing a semiconductor device provided with a semiconductor element that is composed of a semiconductor film formed over a transparent substrate, and particularly to a technique that is effective to be applied to a method of manufacturing a semiconductor device having a crystalline semiconductor film, typically, a silicon film.

2. Description of the Related Art

In recent years, there has been a progress in a development of a semiconductor device in which a thin film transistor (TFT) is formed with a semiconductor thin film (having a thickness in the range substantially from several nanometers to several hundred nanometers) formed over a substrate having an insulating surface and a large area integrated circuit is formed with the TFT.

As a related method of fabricating a TFT, there is a method in which a metal element is added to an amorphous semiconductor film followed by forming a crystalline semiconductor film at a low temperature (600° C. or less) and for a short time (from 1 hour to 12 hours) (hereinafter referred to as "solid phase epitaxy with metal element") (Reference 1: Japanese Patent Laid-Open No. 7-130652).

Further, there is also a method of fabricating a semiconductor film in which after the solid phase epitaxy with metal element, a crystalline semiconductor film is formed by laser irradiation (hereinafter referred to as "laser annealing") (Reference 2: Japanese Patent Laid-Open No. 7-161634). According to the technique of the Reference 2, the crystallinity of a semiconductor film is improved, resulting in an improvement in the electrical characteristics of a thin film transistor having the semiconductor film.

It is known that the crystalline semiconductor films fabricated according to the Reference 1 and Reference 2 have different concentrations of metal elements.

FIG. 6 shows concentration ratios of nickel to silicon in crystalline silicon films after the removal of the Ni element measured with TXRF (Total Reflection X-ray Fluorescence Spectroscopy). The result of measurements of sample A and sample B are shown in FIG. 6, wherein sample A indicates a crystalline silicon film fabricated according to the technique of the Reference 1 (solid phase epitaxy with metal element), and sample B indicates a crystalline silicon film fabricated according to the technique of the Reference 2 (solid phase epitaxy with metal element and laser annealing). As shown in FIG. 6, the crystalline silicon film fabricated according to the technique of the Reference 2 (sample B) is lower in the concentrations of Ni in the film, that is, in the concentration of a metal element. Accordingly, by processing under the condition of a lower temperature for a shorter time according to the technique, fabricating a TFT that is lowered in off-current and power consumption can be realized.

On the other hand, the inventors have found that the crystalline semiconductor film fabricated by laser irradiation after heating an amorphous semiconductor film added with a metal element according to the Reference 2 has a distortion resulting from crystal defects in a vicinity of a substrate or an insulating film for blocking impurities from the substrate.

FIG. 5A is a TEM diagram of a section of a crystalline semiconductor film obtained by exposure to an excimer laser beam. Meanwhile, FIG. 5B is a schematic diagram of the FIG. 5A. FIGS. 5A and 5B show: a region *1 denoting a crystalline semiconductor film; a region *3 denoting a silicon nitride oxide film as a blocking film; a topside of the region *1 (region *4 in FIG. 5B) denoting an amorphous silicon film as a protective film; and a region *2 and a region *2a respectively denoting defect parts of the crystalline silicon film.

It is considered that such defects are developed since a semiconductor film, typically a silicon film, is not completely melted by the laser annealing with an excimer laser beam. In the case where a semiconductor film having such defect parts is used in a TFT, the electrical characteristics of the TFT is adversely affected. A potential level in a grain boundary caused by the crystal defects and the like causes a deterioration of the carrier mobility. Accordingly, in the TFT fabricated according to the technique of the Reference 2, it is considered that, when the crystal defects in the semiconductor film can be reduced, on-current and mobility can be improved and an S value can be reduced, resulting in a further improvement in the electrical characteristics of the TFT.

Furthermore, it is known that the solid solubility of a metal element is higher in an amorphous portion than in a crystalline portion. It is inferred that since a crystal defect part is lower in the crystallinity, the metal element tends to segregate in the crystal defect part. From these, it is considered that when the crystal defects in the semiconductor film are reduced, and a concentration of residual metal element segregating in the defect parts is reduced thereby, similarly, the electrical characteristics of the TFT can be improved.

SUMMARY OF THE INVENTION

The present invention was made in view of the above problems. It is an object to apply, to a semiconductor device having a semiconductor film, a technique that reduces crystal defects in the semiconductor film, and a technique by which the metal element is effectively removed thereby forming a semiconductor film with high crystallinity, and to fabricate semiconductor elements (thin film transistors, thin film diodes, photo-electric conversion elements, or resistor elements) that can realize high performance using the technique. It is a further object of the present invention to provide a semiconductor device having a large-scale integrated circuit in which a TFT having an excellent semiconductor film is used as a constituent element.

An outline of the present invention is in a steps that an amorphous semiconductor film is formed over a transparent substrate; a metal element is added to the semiconductor film followed by being heated; thereafter, the semiconductor film is irradiated with a laser beam thereby forming a thin film element having a crystalline semiconductor film, wherein the semiconductor film is irradiated with a second laser beam which is opposite direction to a first laser beam. Note that, the semiconductor film is irradiated with the first laser beam in a direction from the semiconductor film to the substrate, and the semiconductor film is irradiated with the second laser beam through the substrate in a direction from the substrate to the semiconductor film.

Another outline of the present invention is in a steps that an amorphous semiconductor film is formed over a transparent substrate; a metal element is added to the semiconductor film followed by being heated; thereafter, the semiconductor film is irradiated with a laser beam, thereby forming a thin film element having a crystalline semiconductor film, wherein after the semiconductor film is irradiated with a first laser beam for partially melting and crystallizing the part thereof, the semiconductor film is irradiated with a second laser beam through the substrate in a direction from the substrate to the semiconductor film.

In a crystalline semiconductor film formed by solid phase epitaxy with metal element and laser annealing, the crystal defects are formed between the semiconductor film and a blocking film, that is, in the underside semiconductor film in the vicinity of a substrate. When the semiconductor film is irradiated with the second laser beam through the substrate in a direction from the substrate to the semiconductor film, crystal defects can be directly irradiated with the laser beam. Accordingly, the crystal defects can be efficiently irradiated with the laser beam, and a crystalline semiconductor film with fewer crystal defects can be formed thereby.

Namely, after the crystalline semiconductor film having the defects is irradiated with the second laser beam through the substrate in a direction from the substrate to the semiconductor film and the defects in the crystalline semiconductor film is re-melted followed by re-crystallization, the crystal defects can be reduced thereby.

Furthermore, since the metal element segregated in the crystal defect part can be efficiently removed, in comparison with a TFT formed according to the related method, the electrical characteristics can be further improved.

The substrate that is used in the present invention is a transparent one typically selected from the group consisting of a glass substrate and a quartz substrate can be used. As examples of the glass substrate, substrates made of glass such as barium borosilicate glass or aluminoborosilicate glass can be given.

The first laser beam used for the present invention is a pulsed laser beam having a wavelength range from a visible region to a vacuum ultraviolet region, which is emitted from a gas laser, a solid-state laser, or a metal laser. The laser beam typically used is selected from the group consisting of a laser beam emitted from an excimer laser such as a XeCl laser, a KrCl laser, an ArF laser, a KrF laser, a XeF laser; second, third, and fourth harmonics of a laser beam emitted from a solid-state laser such as a YAG laser, a $YVO_4$ laser, or a YLF laser; a laser beam emitted from a solid-state laser such as a glass laser, a ruby laser, an alexandrite laser, or a Ti: sapphire laser; and a laser beam emitted from a metal laser such as copper vapor laser, gold vapor laser or the like. Further, the first laser beam is irradiated by focusing a laser beam emitted from one of the above lasers in line, ellipse, or plane shape using an optical system.

The second laser beam used for the present invention is a pulsed laser beam or a continuous wave laser beam having a wavelength range from a visible region to a vacuum ultraviolet region, which is emitted from a gas laser, a solid-state laser, or a metal laser. The laser beam typically used is selected from the group consisting of a pulsed laser beam emitted from an excimer laser such as a XeCl laser, a KrCl laser, an ArF laser, a KrF laser, a XeF laserr; a continuous wave laser beam emitted from a gas laser such as an Ar laser and a Kr laser; a pulsed or continuous wave laser of second, third, and fourth harmonics emitted from a solid-state laser such as a YAG laser, a $YVO_4$ laser, or a YLF laser; a laser beam emitted from a solid-state laser such as a glass laser, a ruby laser, an alexandrite laser, or a Ti: sapphire laser; a continuous wave laser beam emitted from helium cadmium laser; or a pulsed laser beam emitted from a metal laser such as copper vapor laser, gold vapor laser or the like. Further, the second laser beam is irradiated by focusing a laser beam emitted from one of the above lasers in line, ellipse, or plane shape using an optical system.

In the second laser beam, the laser beam having a wavelength range in the ultraviolet region to the vacuum ultraviolet region, typified by the laser beam selected from the group comprising of a laser beam emitted from a pulsed excimer laser of such as a XeCl laser, a KrCl laser, an ArF laser, a KrF laser, or a XeF laser and third and fourth harmonics of the pulsed and continuous wave solid-state laser such as a YAG laser, a $YVO_4$ laser or a YLF laser, is attenuated in the energy density thereof in the course of transmission through the transparent substrate; however, respective lasers above have a sufficient energy density to melt the defects formed at an interface between the first insulating film and the crystalline semiconductor film and to re-crystallize them.

A method of manufacturing a semiconductor device according to such subject matter of the present invention may have one of the structures described below.

The present invention is characterized by the steps of: forming a crystalline semiconductor film with a metal element over a transparent substrate; thereafter irradiating with a first laser beam to the crystalline semiconductor film in a direction from the semiconductor film to the substrate; and thereafter irradiating with a second laser beam to the crystalline semiconductor film through the substrate in a direction from the substrate to the semiconductor film.

The present invention is characterized by the steps of: forming a crystalline semiconductor film with a metal element over a transparent substrate thereafter irradiating with a first laser beam to the crystalline semiconductor film in a direction from the semiconductor film to the substrate, thereby melting and crystallizing the crystalline semiconductor film; and thereafter irradiating with a second laser beam to the crystalline semiconductor film, thereby melting and re-crystallizing the crystalline semiconductor film in a direction from the substrate to the semiconductor film.

The present invention is characterized by the steps of: forming a crystalline semiconductor film with a metal element over a transparent substrate; thereafter irradiating with a first laser beam to the crystalline semiconductor film in a direction from the semiconductor film to the substrate, thereby melting and crystallizing the crystalline semiconductor film; and thereafter irradiating with a second laser beam to the crystalline semiconductor film through the substrate in a direction from the substrate to the semiconductor film, thereby reducing the defects in the crystalline semiconductor film.

The present invention is characterized by the steps of: forming an amorphous semiconductor film over a transparent substrate; adding a metal element to the amorphous semiconductor film followed by heating thereby forming a crystalline semiconductor film; thereafter irradiating with a first laser beam to the semiconductor film in a direction from the semiconductor film to the substrate; and thereafter irradiating with a second laser beam to the crystalline semiconductor film through the substrate in a direction from the substrate to the semiconductor film.

The present invention is characterized by using the first laser beam which is a pulsed laser beam having a wavelength range from a visible region to a vacuum ultraviolet region, and the second laser beam which is a pulsed or continuous wave laser beam having a wavelength range from a visible region to a vacuum ultraviolet region.

The present invention is characterized that each of the first and second laser beams is emitted from a laser selected from the group consisting of a gas laser, a solid-state laser, and a metal laser.

The examples of the first laser used in the present invention are given as follows: a laser beam emitted from an excimer laser such as a XeCl laser, a KrCl laser, an ArF laser, a KrF laser, and a XeF laser; second, third, fourth harmonics of a solid-state laser such as a YAG laser, a YVO$_4$ laser, or a YLF laser; a solid-state laser beam emitted from a glass laser, a ruby laser, an alexandrite laser, a Mi: sapphire laser; or a copper vapor laser, a gold vapor laser.

In the present invention, typical examples of the second laser beam are selected from the group consisting of laser beams emitted from pulsed excimer lasers of such as a XeCl laser, a KrCl laser, an ArF laser, a KrF laser, a XeF laser, laser beams emitted from gas lasers such as a continuous Ar laser, Kr laser, second through fourth higher harmonics of solid-state lasers such as a pulsed or continuous wave YAG laser, YVO$_4$ laser, and YLF laser, or laser beams emitted from solid-state lasers such as a glass laser, a ruby laser, an alexandrite laser, a Ti: sapphire laser and the like, or a continuous wave laser beam emitted from a He—Cd laser, or a pulsed laser beam emitted from metal lasers such as a copper vapor laser, a gold vapor laser.

DESCRIPTION OF THE PREFERRED EMBODIMENTS

A method of fabricating a TET using a method of fabricating a crystalline semiconductor film according to the present invention will be detailed below with reference to the drawings.

Embodiment Mode 1

A mode including the following steps will be explained with reference to FIGS. 1A to 1E: an amorphous silicon film formed over a transparent substrate is irradiated with a first laser beam, thereby forming a crystalline silicon film; and thereafter, the crystalline silicon film is irradiated with a second laser beam through the substrate in a direction from the substrate to the semiconductor film, thereby forming a crystalline semiconductor film.

Figure 1A:
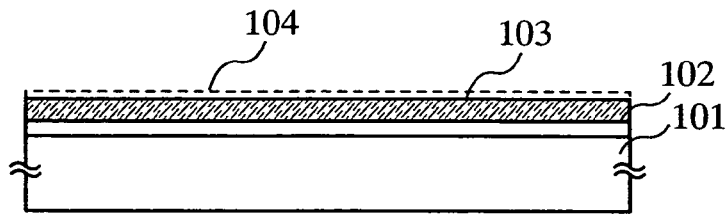
FIGS. 1A-1E show fabricating method of a crystalline silicon film according to the present invention.

First, as shown in FIG. 1A, on a glass substrate 101, a first insulating layer 102 including insulating films such as a silicon oxide film, a silicon nitride film or a silicon oxynitride film ($SiO_xN_y$) is formed.

In the next place, on the first insulating layer 102, an amorphous silicon film 103 is formed by means of a plasma CVD process at a heating temperature of 300° C. At this time, the film thickness is in the range of from 20 nm to 60 nm. An upper limit of the film thickness corresponds to an upper limit value for operating as a completely depleted type in a channel forming region of the TFT; a lower limit of the film thickness is due to a restriction on a process and is determined as a minimum value necessary for the selective processing applied in the etching step of the crystalline silicon film. Meanwhile, in order to operate the film as a partially depleted type, an amorphous silicon film is formed with a thickness of 60 nm or more (preferably in the range of from 100 nm to 200 nm). Furthermore, in place of the amorphous silicon film, an amorphous silicon germanium $Si_{1-x}Ge_x$ (x=0.001 to 0.05) film may be applied. Thereafter, on the amorphous silicon film, a solution 104 containing a metal element such as nickel, cobalt, platinum, and palladium that promotes the crystallization of the amorphous silicon is applied. The film is thereafter heated at a temperature in the range of from 500° C. to 650° C. for from 1 hour to 12 hours thereby forming a crystalline silicon film.

Figure 1B:
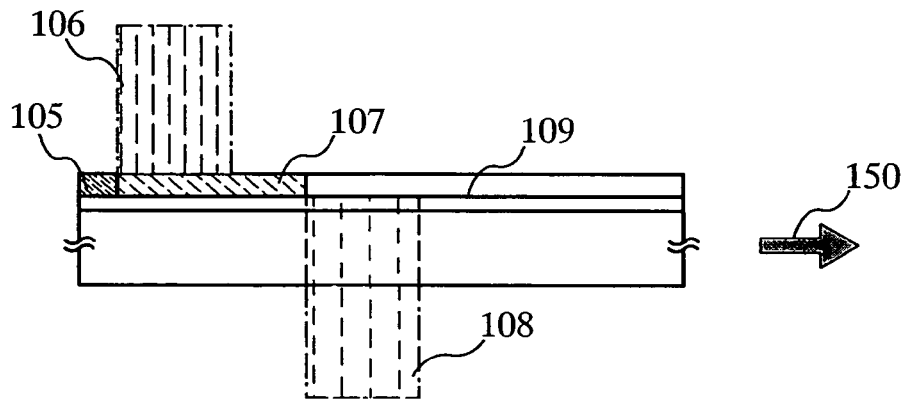

Subsequently, as shown in FIG. 1B, the substrate is moved in a direction of an arrow 150, a crystalline silicon film 105 is irradiated with a first laser beam 106 thereby improving the crystallinity thereof. In a crystalline silicon film 107 of which 5 crystallinity is improved, defects are caused in an interface between the crystalline silicon film and the first insulating film; accordingly, the crystalline semiconductor film is irradiated with a second laser beam 108 through the substrate in a direction from the substrate to the semiconductor film, thereby forming a crystalline silicon film 109 in which defects are reduced.

As the first laser beam, a pulsed laser beam emitted from a gas laser, a solid-state laser or a metal laser and having a wavelength range from a visible region to a vacuum ultraviolet region is used. Typical examples of the pulsed laser beam emitted from a gas laser, a solid-state laser or a metal laser and having a wavelength range from a visible region to a vacuum ultraviolet region are laser beams emitted from excimer lasers of such as a XeCl laser, a KrCl laser, an ArF laser, a KrF laser and a XeF laser; the second through fourth harmonics of the solid-state lasers such as a YAG laser, a YVO$_4$ laser, and a YLF laser; laser beams emitted from solid-state lasers such as a glass laser, a ruby laser, an alexandrite laser, and a Ti: sapphire laser; or laser beams emitted from metal lasers such as a copper vapor laser and a gold vapor laser. Furthermore, as the first laser beam, the beam emitted from the above laser is focused in line, ellipse, or plane shape by use of an optical system for the irradiation. According to this embodiment mode, the substrate is moved in the direction 150 and is irradiated with the laser beam; however, with the substrate fixed, the laser beam may be transferred in a direction opposite to that of the arrow 150.

As the second laser beam, pulsed or continuous wave laser beam emitted from a gas laser, a solid-state laser or a metal laser and having a wavelength range from a visible region to a vacuum ultraviolet region is used. Typical examples of the pulsed or continuous wave laser beams emitted from a gas laser, a solid-state laser or a metal laser and having a wavelength range from a visible region to a vacuum ultraviolet region are laser beams emitted from pulsed excimer lasers of a XeCl laser, a KrCl laser, an ArF laser, a KrF laser, and a XeF laser; laser beams emitted from continuous wave gas lasers such as Ar laser and Kr laser; the second through fourth higher harmonics of the solid-state lasers such as pulsed or continuous wave YAG laser, YVO4 laser, and YLF laser; laser beams emitted from solid-state lasers such as a glass laser, a ruby laser, an alexandrite laser, and a El: sapphire laser; continuous wave laser beam emitted from a He—Cd laser; or pulsed laser beams emitted from metal lasers such as a copper vapor laser and a gold vapor laser. Furthermore, the second laser beam emitted from the above laser oscillator is focused in line, ellipse, or plane shape by use of an optical system for the irradiation.

In the second laser beam, the laser beams having a wavelength range in a ultraviolet region to a vacuum ultraviolet region, typically, the laser beams emitted from the pulsed excimer lasers of such as a XeCl laser, a KrCl laser, an ArF laser, a KrF laser, and a XeF laser or the third or fourth harmonics of the solid-state lasers such as pulsed or continuous wave YAG laser, $YVO_4$ laser and YLF laser are attenuated in the energy density thereof in the course of transmitting the transparent substrate; however, they have a sufficient energy density to melt the defects formed at an interface between the first insulating film and the crystalline semiconductor film and to re-crystallize them.

Figure 1C:
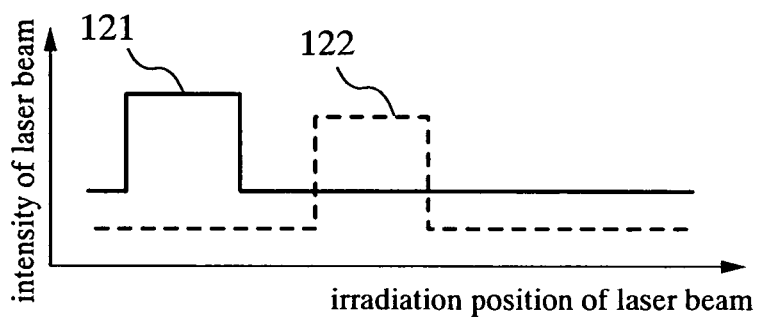

Laser beam irradiation positions of the first and second laser beams here are shown in FIG. 1C. In this embodiment mode, an irradiation position 121 of the first laser beam and the position 122 of the second laser beam are not overlapped; however, depending on the energy density of the laser beam, when the defects remain in part even after the irradiation with the first laser beam, the part may further be irradiated with the second laser beam which is overlapped with the part irradiated with the first laser beam.

Figure 2:
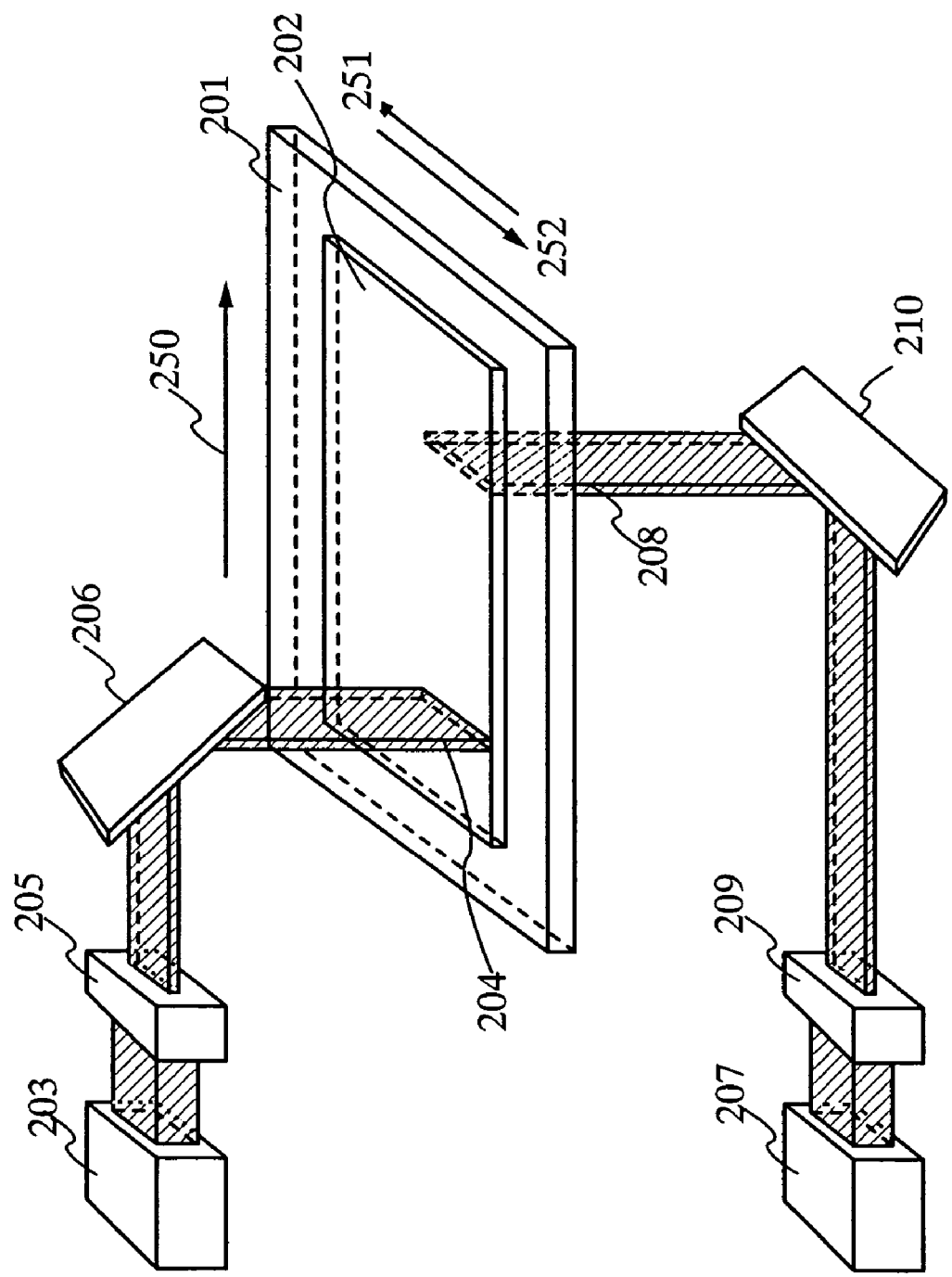
FIG. 2 shows a laser irradiation apparatus according to the present invention.

In the next place, a laser annealing apparatus that is used in this embodiment mode will be explained with reference to FIG. 2. A substrate 202 placed on a transfer table 201 is irradiated with a first laser beam 204 emitted from a first laser oscillator 203. The first laser beam 204 is focused in line, ellipse, or plane shape by means of a first optical system 205. Furthermore, in FIG. 2, the substrate is irradiated with a first laser beam with a first mirror 206; however, the first mirror 206 may not be used.

The substrate is moved in a transfer direction 250 and is irradiated with a second laser beam 208 emitted from a second laser oscillator 207. The second laser beam 208 is focused in line, ellipse or plane shape by means of a second optical system 209. Furthermore, in FIG. 2, the substrate is irradiated with the laser beam with a second mirror 210; however, the second mirror may not be used.

Furthermore, when the transfer table is moved in directions 251 and 252 perpendicular to a direction 250 from an irradiation position of the first laser beam to an irradiation position of the second laser beam, an entire surface or a desired area of the substrate 202 can be efficiently annealed.

Still furthermore, the transfer table 201, in order to obtain higher transmittance of the second laser beam for exposing the semiconductor film through the substrate, is preferably made of a transparent member such as BK7 or quartz.

Figure 1D:
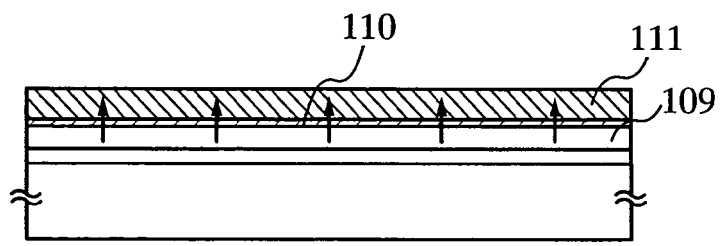

Subsequently, as shown in FIG. 1D, the gettering process is applied thereby removing impurities such as metal elements and the like contained in the crystalline silicon film. A concentration of the metal element intentionally added in the process of the crystallization is reduced to $1 \times 10^{17}/cm^3$ or less (a lower measurement limit of SIMS (secondary ion mass spectrometry) or less). As a gettering site, an amorphous silicon film 111 is formed over the crystalline silicon film 109 so as to sandwich a barrier layer 110 therebetween.

For the barrier layer, silicon oxide is used. In the amorphous silicon film 111 for gettering, $1 \times 10^{20}/cm^3$ or more of an impurity element such as phosphorus or boron, or a rare gas element such as Ar, Kr or Xe, or oxygen or nitrogen is contained thereby increasing the solid solubility of the metal element. Thereafter, the heat treatment is performed thereby moving the metal element into the amorphous silicon film for gettering. For the heat treatment, an RTA process with a lamp as a light source or an RTA process with a heated gas (gas RTA) is applied. Alternatively, the heat treatment is performed using an annealing furnace. Owing to the heat treatment, the metal element segregates toward the amorphous silicon film for gettering, resulting in highly purification of the crystalline silicon film. After the heat treatment, the amorphous silicon film for gettering is removed by means of dry etching with $NF_3$ or $CF_4$, the dry etching that uses $ClF_3$ but does not use plasma, or wet etching with an alkaline solution such as an aqueous solution containing hydrazine or tetraethyl ammonium hydroxide (chemical formula: $(CH_3)_4NOH$). Furthermore, the barrier layer is etched out with hydrofluoric acid thereby forming a crystalline silicon film 112 in which the concentration of the metal element and the crystal defects are reduced.

The gettering process is not limited to the method mentioned above, known methods can be used.

Thereafter, according to the known process, a semiconductor element (a thin film transistor, thin film diode, photo-electric conversion element or resistor element) is fabricated with the crystalline silicon film.

Figure 6:
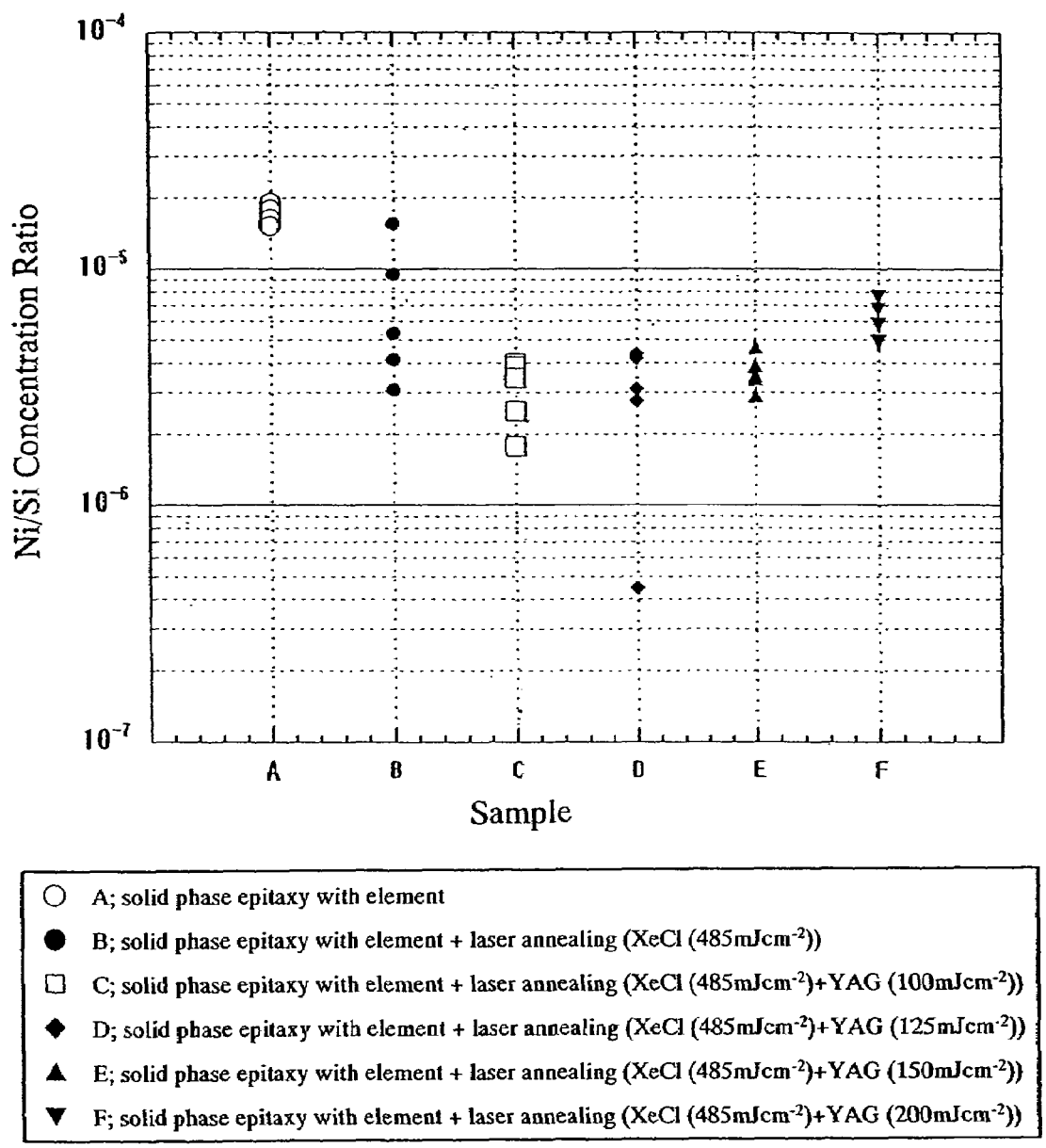
FIG. 6 shows nickel concentrations in crystalline silicon films formed according to the present invention.

FIG. 6 shows the result of measurements of concentration ratios of nickel to silicon in crystalline silicon films fabricated according to the process of Embodiment Mode 1 with total reflection X-ray fluorescence spectrometry (TXRF). Sample A (white circle mark (○)) denotes a concentration ratio of nickel to silicon in a crystalline silicon film after the gettering process. The crystalline silicon film is formed only by solid phase epitaxy process with metal element.

Sample B (black circle mark (●)) denotes a concentration ratio of nickel to silicon in a crystalline silicon film after the gettering process. The crystalline silicon film is formed by solid phase epitaxy with metal element and irradiated with only a XeCl excimer laser beam (irradiation energy of the laser beam: 485 mJ/cm$^2$) as the first laser beam.

Sample C (square mark (□)), Sample D (rhombus mark (♦)), Sample E (triangle mark (▲)) and Sample F (inverted triangle mark (▼)), respectively denote concentration ratios of nickel to silicon in the crystalline silicon films after the gettering process. The crystalline silicon films are formed by solid phase epitaxy with metal element, irradiated with a XeCl excimer laser beams as the first laser beams (irradiation energy of the first laser beam: 485 mJ/cm$^2$), and thereafter irradiated with a YAG laser beams as the second laser beams (irradiation energy of the second laser beam for sample C: 100 mJ/cm$^2$, irradiation energy of the second laser beam for sample D: 125 mJ/cm$^2$, irradiation energy of the second laser beam for sample E: 150 mJ/cm$^2$, and irradiation energy of the second laser beam for sample F: 200 mJ/cm$^2$) through the substrates in a direction from the substrate to the silicon films.

It is found that the crystalline silicon films formed by the irradiation with the first laser beam followed by the irradiation with the second laser beam through the substrate in a direction from the substrate to the silicon films (square mark (□), rhombus mark (♦), triangle mark (▲) and inverted triangle mark (▼) in FIG. 6) are reduced in the dispersion of the Ni/Si ratio and improved in the gettering efficiency.

Figure 7A:
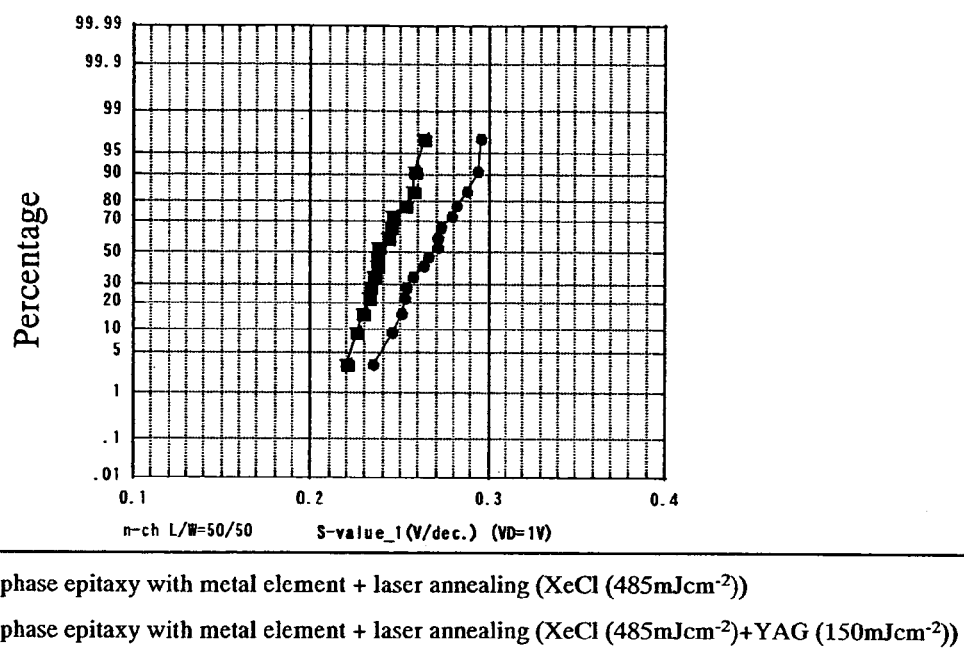
FIGS. 7A and 7B show value of crystalline silicon films formed according to the present invention.
Figure 7B:
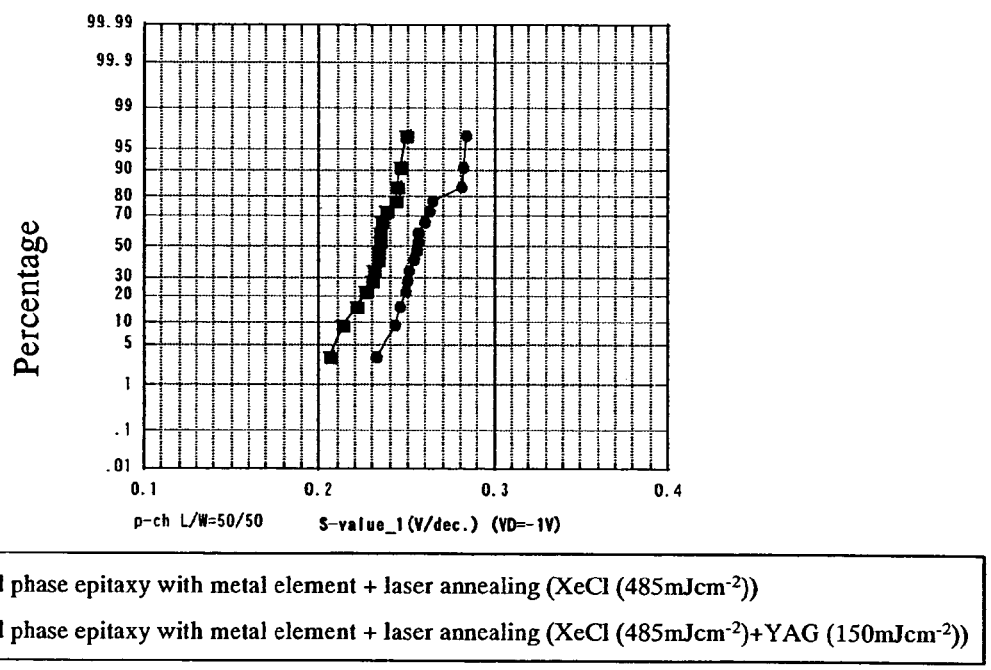

Next, the S values of TFTs that were fabricated according to Embodiment Mode 1 are shown in FIGS. 7A and 7B. FIG. 7A shows the S values of n-channel TFTs and FIG. 7B shows the S values of p-channel TFTs respectively. The plot expressed as circle mark ( ) shows the S values of the TFTs having a crystalline silicon film. The crystalline silicon film is formed by the irradiation with only the XeCl excimer laser beam as the first laser beam (energy density: 485 mJ/cm$^2$). Meanwhile, the plot expressed as square mark (□) shows the S values of the TFTs having a crystalline silicon film. The crystalline silicon film is formed by the irradiation of the XeCl excimer laser beam (energy density: 485 mJ/cm$^2$) as the first laser beam, and the irradiation with the YAG laser beam (energy density: 150 mJ/cm$^2$) as the second laser beam thereafter. In both the n-channel TFTs and p-channel TFTs, the S values are reduced; accordingly, it is found that the defects in the crystalline silicon films are reduced, the crystallinity thereof is improved thereby.

Thus, according to the present invention, a crystalline silicon film in which defects are less and a concentration of a residual metal element in the crystalline silicon film also less can be fabricated using a crystalline silicon film formed by adding a metal element. A TFT using the crystalline silicon film as an active layer can be further reduced in off-current and suppressed in consumption power in comparison with a TFF fabricated according to a related technique. Furthermore, since the S value is low, the TFT can be operated at a higher speed with lower voltages.

Embodiment Mode 2

Figure 3A:
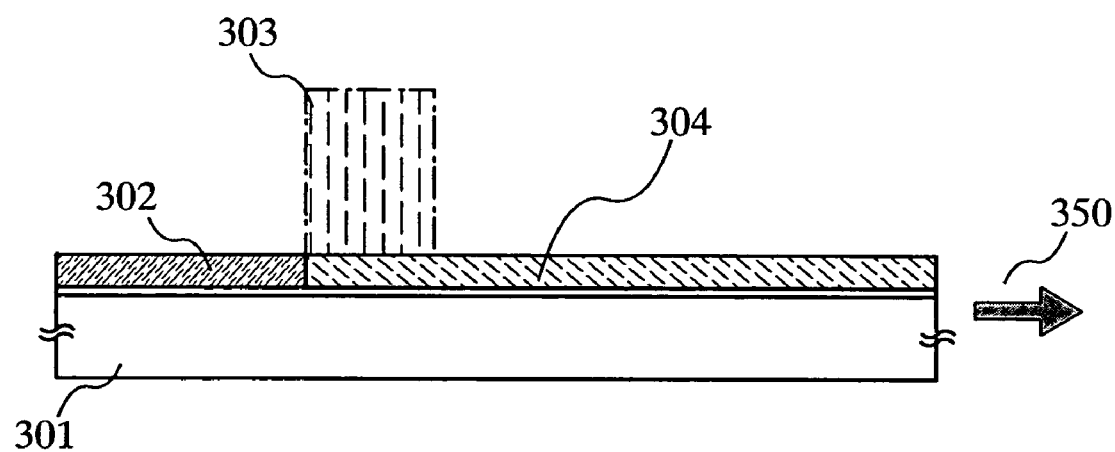
FIGS. 3A and 3B show laser irradiation apparatus according to the present invention.
Figure 3B:
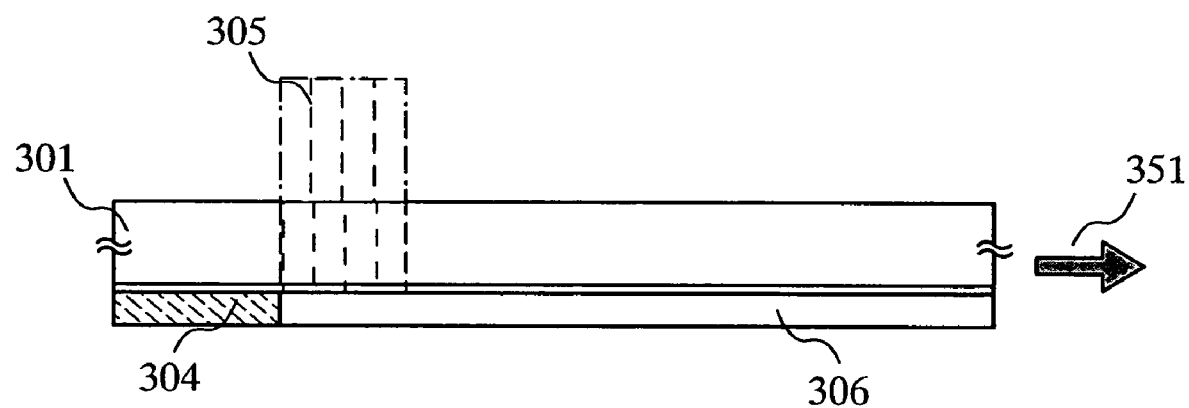

In this embodiment mode, FIGS. 3A and 3B are used for showing the process of irradiation with a first laser beam to a semiconductor layer wholly in a direction from the semiconductor layer to a substrate and thereafter irradiation with a second laser beam to the semiconductor layer wholly through the substrate in a direction from the substrate the semiconductor layer.

As shown in FIG. 3A, similarly to Embodiment Mode 1, a crystalline silicon film 302 is formed over a transparent substrate 301, and the surface of a semiconductor layer is wholly irradiated with a first laser beam in a direction from the semiconductor layer to the substrate while the substrate 301 is moved in a direction of an arrow 350 to form a crystalline silicon film 304. Note that, the scope irradiated with the first laser beam is the crystalline silicon film 304, in a part of which defects are formed.

Next, as shown in FIG. 3B the substrate 301 is irradiated with a second laser beam 305 through the substrate 301 in a direction from the substrate to the semiconductor layer while the substrate 301 is moved in a direction of an arrow 351 to form a crystalline silicon film 306 in which the defects are reduced. Note that, in FIG. 3B, the crystalline silicon film is reversed after irradiation with a first laser beam, and irradiated with a second laser beam in the same side of the first laser beam through a substrate. Alternatively, the crystalline silicon film may be irradiated with the second laser beam through the substrate in a counter side of the first laser beam without reversing the substrate.

Subsequently, the crystalline silicon film is etched with a desired pattern according to a related method, and a gate insulating film, a gate electrode, a source region, a drain region, and a channel forming region are formed to fabricate a TFT.

Thus, the present invention makes it possible to form a TFT having a crystalline silicon film with fewer defects as an active layer. Namely, a TFT which provides a short rise time and high-speed performance can be fabricated.

EMBODIMENTS

Embodiment 1

An embodiment according to the present invention will be explained with reference to FIGS. 1A to 4. Here, a method of fabricating a TFT over a substrate according to the invention will be detailed.

As shown in FIG. 1A, a first insulating film 102 is formed on a transparent glass substrate 101. The first insulating film may be a single layer or a laminated one. In this embodiment, a first silicon oxide nitride film and a second silicon oxide nitride film are laminated. Note that, the first silicon oxide nitride film is deposited by the plasma CVD method with $SiH_4$, $NH_3$ and $N_2O$ as reaction gases on a substrate heated at 400° C. and thereby having a nitrogen contain larger than or substantially equal to an oxygen content, and the second silicon oxide nitride film is deposited by the plasma CVD method with $SiH_4$ and $N_2O$ as reaction gases on a substrate heated at 400° C. and thereby having an oxygen content larger than that of nitrogen.

Subsequently, an amorphous silicon film 103 is formed on the first insulating layer 102 by the plasma CVD at heat temperature of 300° C. A film thickness of the amorphous silicon film is the range of from 20 nm to 60 nm. Subsequently, an oxide film (not shown in the drawing) is formed on a surface of the amorphous silicon film by using ozone water. Still subsequently, in order to promote the crystallization of the amorphous silicon film, a solution containing nickel (5 ppm) is spin-coated on the amorphous silicon film thereby forming a thin film of a metal element 104 followed by the dehydrogenation performed by heating at 500° C. for 1 hour to remove hydrogen, further followed by heating at 500° C. for 4 hours, and a crystalline silicon film is formed thereby.

Subsequently, as shown in FIG. 1B, a crystalline silicon film 105 is irradiated with a first laser beam 106 to improve the crystallinity of the crystalline silicon film. At this time, as the first laser beam 106, excimer laser beam having a laser pulse oscillating frequency of 30 Hz and a laser energy density of from 300 mJ/cm$^2$ to 500 mJ/cm$^2$ can be used. In this embodiment, an excimer laser beam of 485 mJ/cm$^2$ is used. Here, the excimer laser beam is focused in line with an optical system for the irradiation.

Subsequently, the crystalline silicon film 107 is irradiated with a second laser beam 108 through the substrate 101 in a direction from the substrate to the silicon film to reduce the defects of the crystalline silicon film 107, which are formed in an interface between the first insulating film and the crystalline silicon film, to form a crystalline silicon film 109 with high crystallinity. As the second laser beam, a YAG laser beam having a laser pulse oscillating frequency of 30 Hz and a laser energy density of from 100 mJ/cm$^2$ to 200 mJ/cm$^2$ can be used. In this embodiment, a 150 mJ/cm$^2$ YAG laser beam is focused in line by use of an optical system for the irradiation.

A melting time of the crystalline silicon film irradiated with the laser beam is substantially 100 nsec, accordingly an interval between irradiations with the second laser beam and the first laser beam is set at 100 nsec or more. With this step, the defects formed owing to the irradiation with the first laser beam can be reduced by the irradiation with the second laser beam.

Subsequently, as shown in FIG. 1D, the gettering process is applied and thereby impurities such as metal elements and so on, which are contained in the crystalline silicon film 109, are removed. A concentration of the metal element intentionally added in the process of the crystallization is reduced to $1\times10^{17}/cm^3$ or less (a lower measurement limit of SIMS (secondary ion mass spectrometry) or less). As a gettering site, an amorphous silicon film 111 is formed over the crystalline silicon film 109 so as to sandwich a barrier layer 110 therebetween. For the barrier layer 110, silicon oxide is used. In the amorphous silicon film 111 for gettering, $1\times10^{20}/cm^3$ or more of Ar is added thereby increasing the solid solubility of the metal element. Thereafter, heat treatment is performed using an annealing furnace for four hours at 550° C. Owing to the heat treatment, the metal element segregates toward the amorphous silicon film for gettering, and high purification of the crystalline silicon film can be achieved. After the heat treatment, the amorphous silicon film for gettering is removed by wet etching with an alkaline solution such as an aqueous solution containing hydrazine or tetraethyl ammonium hydroxide (chemical formula: $(CH_3)_4NOH$). Furthermore, the barrier layer is etched out with hydrofluoric acid.

Figure 1E:
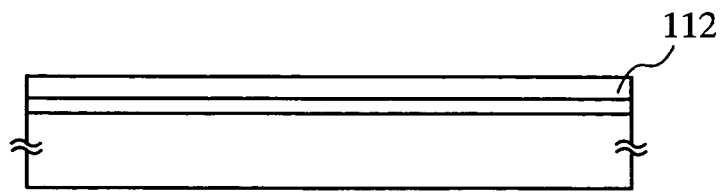

Thus, as shown in FIG. 1E, a crystalline silicon film 112 is formed. When a pulsed laser beam is used for the irradiation, in some cases, the surface smoothness may be reduced. In order to eliminate a lot of projected portions formed on a surface and to improve the smoothness thereof, an oxidizing process with an aqueous solution containing ozone water and an oxide film removing process with an aqueous solution containing hydrofluoric acid are applied once, preferably repeated by a plurality of times. At this time, a maximum value of irregularities on a surface of the crystalline silicon film is made 10 nm or less, preferably 5 nm or less.

Figure 4:
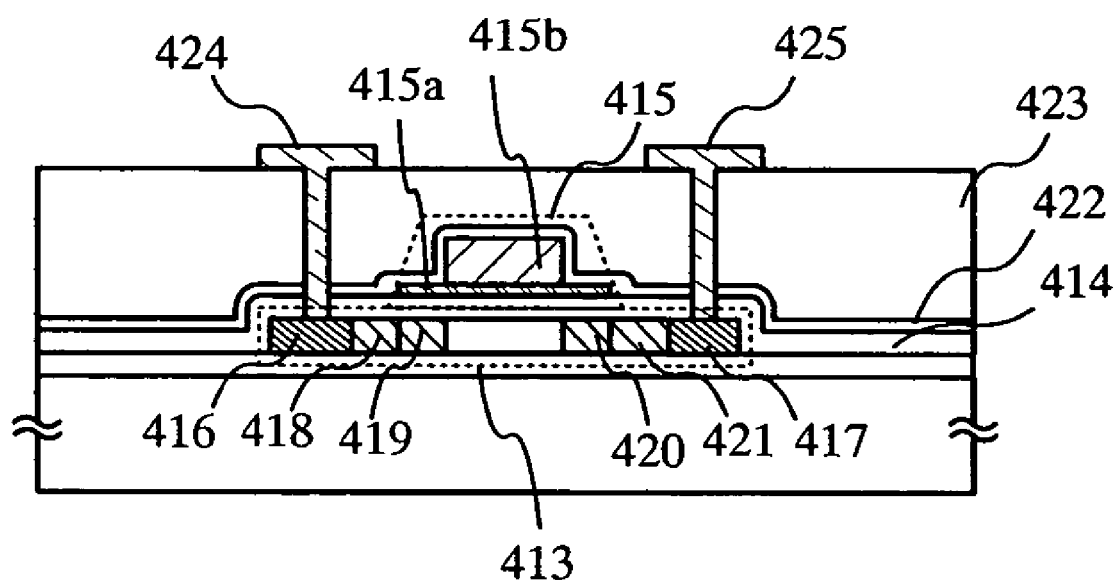
FIG. 4 shows a semiconductor device manufactured according to the present invention.
Figure 5A:
FIGS. 5A and 5B show crystalline silicon films formed according to the present invention in section.
Figure 5B:
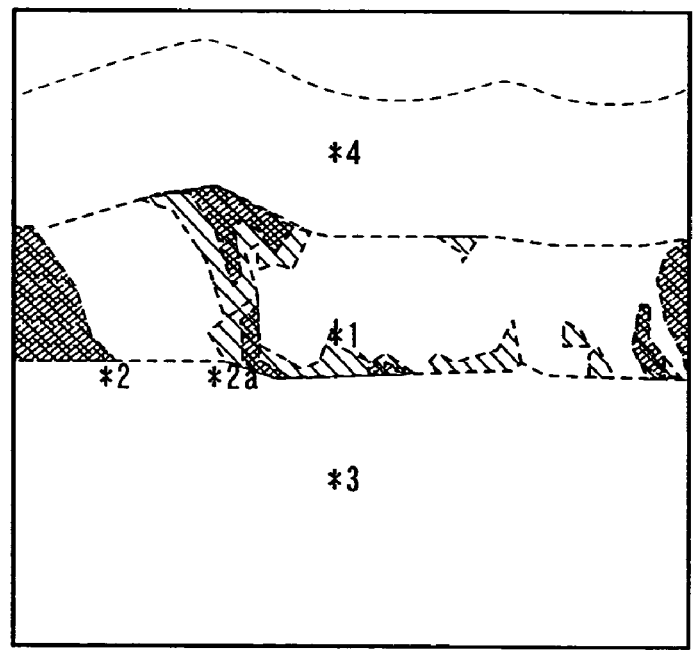

Thereafter, as shown in FIG. 4, the crystalline silicon film is etched with a desired shape thereby forming an activation layer 415. Subsequently, after a surface of the semiconductor film is cleaned with an etchant containing hydrofluoric acid, an insulating film that consists a gate insulating film 414 and contains silicon as a main component.

Subsequently, after a surface of the gate insulating film 414 is cleaned, a gate electrode 415 is formed. In this embodiment, the gate electrode 415 has a laminated structure and includes a first conductive film 415 adjacent to the gate insulating film and a second conductive film 415b adjacent to the first conductive film 415a. The first conductive film is formed with a tantalum nitride film and the second conductive film is formed with a tungsten film. However, gate electrode materials for both the first and second conductive films are not limited to the above materials, and may be formed with an element selected from tantalum (Ta), tungsten (W), titanium (Ti), molybdenum (Mo), aluminum (Al), copper (Cu), chromium (Cr) or neodymium (Nd), or an alloy material or a compound material mainly composed of one of these elements. Furthermore, a silver-copper-palladium alloy (AgPdCu alloy) may be used. Still furthermore, in this embodiment, the gate electrode is formed in a laminated structure; however, without limiting thereto, it may have a single layer structure or a multi-layer structure. As to the fabricating process of the first and second conductive films, the process disclosed in Japanese patent publication No. 2001-345453 can be applied.

Subsequently, an impurity element (P, As or the like) that imparts the n-type conductivity to a semiconductor with, here phosphorus, is appropriately added, thereby forming a source region 416, a drain region 417 and LDD regions 418 through 421. As to a formation process of the LDD regions, the process disclosed in Japanese Patent publication No. 2001-345453 may be applied.

Next, heat treatment, irradiation with intense light, or irradiation with laser beam is applied in order to activate the added impurity element after a second insulating film 422 is formed on the gate electrode and the gate insulating film. Furthermore, simultaneously with the activation, plasma damage to the gate insulating film or to the interface between the gate insulating film and the semiconductor film can be recovered.

Thereafter, a first interlayer insulating film 423 is formed, hydrogenation is applied, contact holes extending to a source region and a drain region are formed, a source electrode 424 and a drain electrode 425 are formed sequentially to complete a TFT fabrication. In this embodiment, the source electrode 424 and the drain electrode 425 are formed by etching a laminate film of a titanium film having a film thickness of 100 nm, an alloy film (typically an alloy film of aluminum and silicon) having a film thickness of 350 nm and a titanium film having a film thickness of 100 nm. As wiring materials, without limiting to Ti and an alloy of Al and Si, other materials with low resistance can be used.

In this embodiment, between a channel forming region and a source region or a drain region that is formed by adding a impurity element on the condition of high concentrations, regions (LDD) 418 through 421 where low concentrations of impurity element is added are provided, and regions 419 and 420 where the LDD regions and the gate electrode are superposed with the gate insulating film interposed therebetween are also disposed.

The present invention is not limited to the structure shown in FIG. 4, and may be a semiconductor film that does not have a LDD region but includes a channel forming region, a drain region and a source region.

Furthermore, here an n-channel TFT is used for the description; however, needless to say, when a p-type impurity element is used in place of the n-type impurity element, a p-channel TFT can be formed.

Embodiment 2

Figure 8:
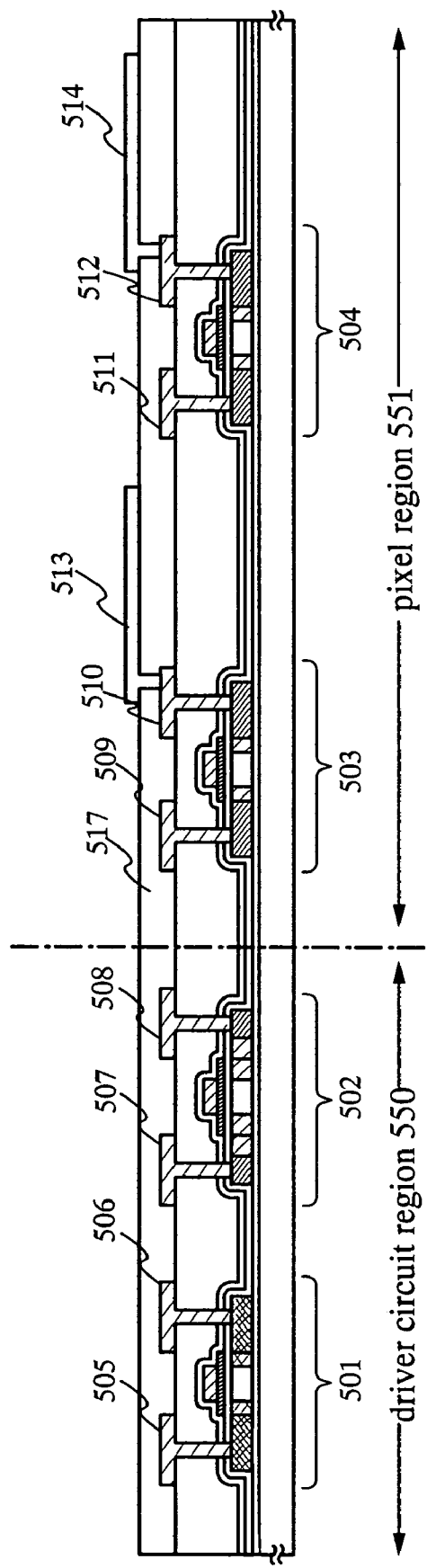
FIG. 8 shows a schematic of an active matrix substrate for a liquid crystal display device according to the present invention.

A method of manufacturing an active matrix substrate for a liquid crystal display device having a driver circuit region and a pixel region will be explained here in reference to FIG. 8.

TFTs are formed in a driver circuit region 550 and a pixel region 551 over the same substrate using the process described in Embodiment 1. Note that, the driver circuit region 550 includes a p-channel TFT 501 and an n-channel TFT 502, and the pixel region 551 includes n-channel TFTs 503 and 504.

Along the lines of the process according to Embodiment 1, after forming source electrodes 505, 507, 509, and 511 and drain electrodes 506, 508, 510, and 512, a second interlayer insulating film 517 is formed. Subsequently, a contact hole is formed which leads to the drain electrode of the n-channel TFT in the pixel region by etching the second interlayer insulating film. Thereafter, a conductive film is formed and pixel electrodes 513 and 514 connecting with drain electrodes are formed.

Note that, when an active matrix substrate used for a reflective liquid crystal display device is manufactured, a metal film with high reflectivity as a pixel electrode such as a film containing aluminum or silver in major component or a lamination film thereof may be used for the material of the pixel electrodes. Further, when an active matrix substrate used for a transmissive liquid crystal display device is manufactured, a translucent conductive film such as ITO (indium tin oxide), indium oxide-zinc oxide alloy ($In_2O_3$—ZnO), zinc oxide (ZnO), or the like may be used for a the material of the pixel electrodes.

Thus, an active matrix substrate for a liquid crystal display device can be manufactured.

Note that, the method for fabricating a crystalline semiconductor film according to Embodiment Mode 1 is applied in this embodiment, however, it is not limited thereto and the method described according to Embodiment Mode 2 may be applied alternatively.

A liquid crystal display device having a crystalline silicon film with fewer defects as an active layer can be manufactured by applying an active matrix substrate according to the present invention. Accordingly, a liquid crystal display device which provides high-speed performance with low voltage can be manufactured.

Further, the concentration of impurity metal element in a crystalline silicon film can be lowered substantially. Namely, off-current is minimized, and a liquid crystal display device with lower power consumption can be fabricated.

Embodiment 3

Figure 9:
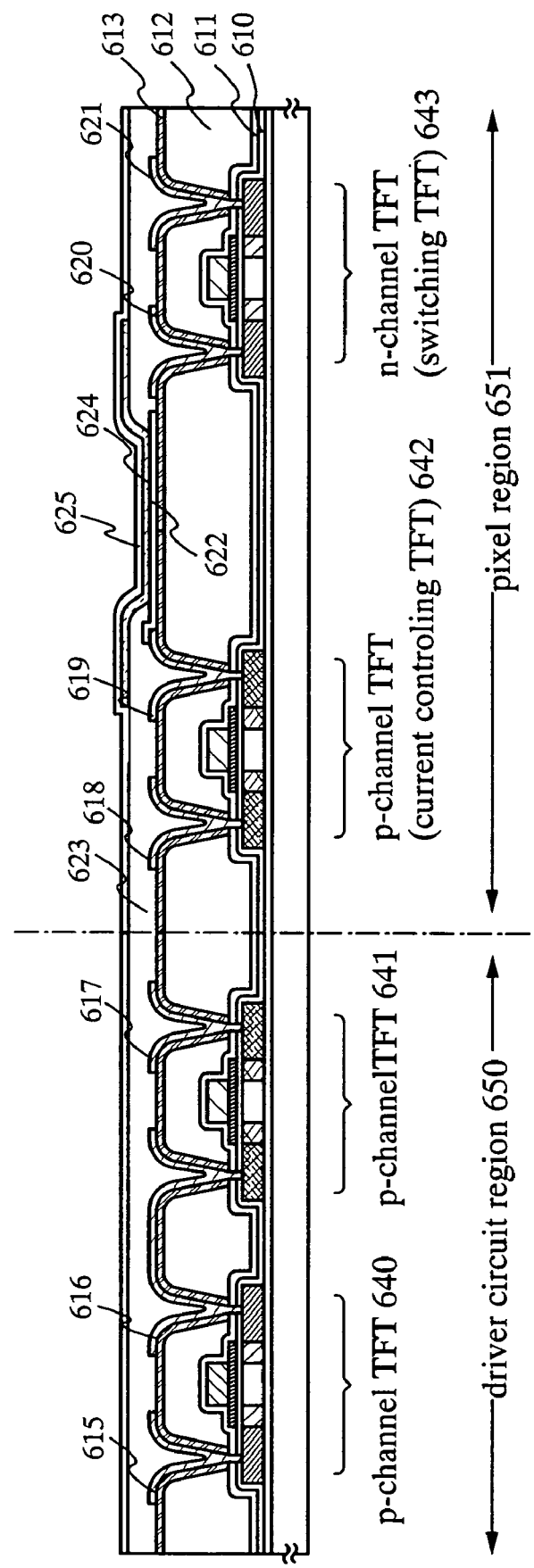
FIG. 9 shows a schematic of an active matrix substrate for a light-emitting device according to the present invention.

A method of manufacturing an active matrix substrate for an EL (electroluminescence) display device having a driver circuit region and a pixel region will be explained here in reference to FIG. 9.

An example of manufacturing an active matrix substrate is shown below.

TFTs are formed in a driver circuit region 650 and a pixel region 651 over the same substrate using the process described in Embodiment 1. Note that, the driver circuit region 650 is includes an n-channel TFT 640 and a p-channel TFT 641, and a pixel region 651 includes an n-channel TFT 643 having a switching function in a pixel, and a p-channel TFT 642 used for current control.

An inorganic insulating film or a resin composed of organic material may be used for a first interlayer insulating film 612 formed over a second insulating film 611. Note that, when an organic resin is used, an resin with positive photosensitivity or negative photosensitivity may be used. When photosensitive organic resin is used, a first opening with a curvature can be formed by performing the exposure in a step of photolithograph, and etching the photosensitive organic resin. Thus, the formation of the opening with a curvature allows electrodes with the higher coverage to be formed. In this embodiment, a photosensitive acrylic resin film with a thickness of 1.05 μm is formed as the first interlayer insulating film. The first opening having a rounded corner is formed thereafter by pattering and etching the first interlayer insulating film.

Note that, since an organic resin with positive photosensitivity is colored with brown, when the first interlayer insulating film 612 is formed with the organic resin with positive photosensitivity, it is required to be decolorized the organic resin with positive photosensitivity after etching.

Next, a third interlayer insulating film 613 formed from a nitride insulating film (generally, a silicon nitride film or a silicon oxynitride film) is formed so as to cover the first opening and the first interlayer insulating film 612. In this embodiment, a silicon nitride film is used for the third interlayer insulating film. Outgas which generates from the first interlayer insulating film can be reduced by forming the third interlayer insulating film containing of a nitride insulating film.

After the exposure by photolithography is performed, the third interlayer insulating film 613, the second interlayer insulating film 611, and a gate insulating film 610 are etched sequentially thereby forming a second opening. A dry etching and a wet etching may be applied to the etching here. In this embodiment, the second opening is formed by dry etching.

After forming the second opening, metal films are formed over the third interlayer insulating film and in the second opening, performed the exposure in a step of photolithography, and then, etched to form source electrodes and drain electrodes 615 through 621. As for the metal film, a film or an alloy film fabricated with an element selected from aluminum (Al), titanium (Ti), molybdenum (Mo), tungsten (W), or silicon (Si) is used. In this Embodiment, a titanium film, aluminum-silicon alloy film, and titanium film (Ti/Al—Si/Ti) are laminated sequentially, in which the film thickness is 100 nm, 350 nm, and 100 nm respectively, thereby patterning and etching to form source electrodes and drain electrodes 615 through 621.

Subsequently, after forming a pixel electrode 622 having a function as an anode and a second insulating film 623, a third opening is formed. An inorganic insulating film or a resin composed of organic material may be used for the second interlayer insulating film 623. In this embodiment, a photosensitive acrylic resin film is formed as the second interlayer insulating film. The third opening having a rounded corner is formed thereafter by patterning and etching the second interlayer insulating film.

Subsequently, a fourth insulating film may be formed. In this case, the fourth insulating film is etching thereby forming a fourth opening so as to exposure the first pixel electrode. When a resin composed of organic material is used, the fourth insulating film has a function of blocking gases generated from the resin composed of organic material and moisture generated from a whole substrate, whereby a deterioration of a layer comprising a light emitting material is prevented.

A layer comprising a light emitting material, a second electrode having a function as a cathode, and passivation film (not shown in the drawing) are formed over the first pixel electrode 622 and the second interlayer insulating film 623. The lamination of the first electrode 622, the layer containing a light emitting material 624, and the second electrode 625 substantially makes a light emitting element (EL element). 5 A known structure can be applied to the layer 624 containing a light emitting material. The layer containing a light emitting material provided between the first electrode 622 and the second electrode 625 includes such as a light emitting layer, a hole injection layer, an electron injection layer, a hole transport layer, and an electron transport layer; the film containing a light emitting material may have a form wherein those layers are laminated, or a form wherein some of the materials or all of the materials, which form those layers, are mixed. An EL element generally has a structure in which an anode, a light emitting layer and a cathode are laminated sequentially. Alternatively, the EL element may have a structure in which an anode, a hole injection layer, a light emitting layer, and a cathode are laminated sequentially, or a structure in which layers such as an anode, a hole injection layer, a light emitting layer, an electron transport layer, and a cathode are laminated sequentially.

A light emitting layer is generally formed from an organic compound. Typically, the light emitting layer has one or a plurality of layers selected from lower molecular organic compounds, intermediate molecular organic compounds, and polymer organic compounds on the basis of their number of molecules. Further, the light emitting layer may be combined with an electron injection-transport layer and a hole injection-transport layer each formed from inorganic compounds which has electron injection-transport layer property or hole injection-transport layer property. Note that, an intermediate molecule is an aggregate (preferably, with polymerization degree of 10 or less) of organic compounds which are not sublimable or resolutive, or an organic compound having catenate molecules with lengths of 5 µm or less (preferably, 50 nm or less).

Light emitting materials which mainly compose the light emitting layer are given below. A metal complex such as tris-8-quinolinolate aluminum complex or bis-(benzoquinolinorate) beryllium complex, phenyl anthracene derivative, tetra-aryl diamine derivative, or distyril benzene derivative may be used as a low molecular organic compound. By using the selected compound as a host material, coumarin derivative, DCM, quinacridon, rubrene, or the like are doped as a dopant, so that a raise in the quantum efficiency, high luminance and improvement in efficiency may be achieved.

A polymer molecular organic compound may be selected from polyparaphenylene vinylenes, polyparaphenylene, polythiophenes, polyfluorenes, and so on. Concretely, it may be selected from poly(p-phenylene vinylene):(PPV), poly(2, 5-dialkoxy-1,4-phenyene vinylene):(RO-PPV), poly[2-(2'-ethylhexoxy)-5-methoxy-1,4-phenylene vinylene]:(MEH-PPV), poly[2-dialkoxyphenyl)-1,4-phenylene vinylene]:(ROPh-PPV), poly[p-phenylene]:(PPP), Poly(2,5-dialkoxy-1,4-phenylene):(RO-PPP), poly(2,5-dihexoxy-1,4-phenylene), polythiophene:(PT), poly(3-alkylthiophene):(PAT), poly(3-hexylthiophene):(PHT), poly(3-cyclohexylthiophene):(PCHT), poly(3-cyclohexyl-4-methylthiophene):(PCHMT), poly(3,4-dicyclohexylthiophene):(PDCHT), poly[3-(4octylphenyl)-thiophene]:(POPT), poly[3-(4-octylphenyl)-2,2-bithiophene]:(PTOPT), polyfluorene:(PF), poly(9,9-dialkylfluorene):(PDAF), poly(9,9-dioctylfluorene):(PDOF), and so on.

An inorganic compound selected from diamond-like carbon (DLC), Si, Ge, CN, and oxides or nitrides thereof, optionally, the above compounds doped with P, B, N, or the like may be used for the electron injecting-transporting layer. Further, it may be oxides, nitrides or fluorides of alkali metals or alkali earth metal. Furthermore, compounds or alloys of these metals with at least one of Zn, Sn, V, Ru, Sm, and In may be used.

Further, a mixed junction structure of the respective layers above may be used.

Note that, the luminescence of an EL element can be divided into two types: one that emits light (fluorescent light) when a singlet excited state returns back to a ground state and another that emits light (phosphorescent light) when a triplet excited state returns back to the ground state. Either or both types of the luminescence can be used for the EL element according to the present invention.

A multi-component alloy or compound, which is constituted of a metal component and a component containing either or both of alkali metal and alkali earth metal, is used for the second electrode 625. Al, Au, Fe, V, and Pd are given as examples of the metal components. Specific examples of alkali metal or alkali earth metal include Li (lithium), Na (sodium), K (potassium), Rb (rubidium), Cs (cesium), Mg (magnesium), Ca (calcium), Sr (strontium), and Ba (barium). In addition, Yb (ytterbium), Lu (lutetium), Nd (neodymium), Tm (thulium), or the like may be applied. The second electrode shall be an alloy or a compound in which 0.01% to 10% by weight of alkali metal or alkali earth metal with the work function of 3 eV or less is contained in the metal component. For the purpose of making the second electrode function as the cathode, the thickness of the second electrode may be appropriately set. The second electrode may be formed by an electron beam evaporation method in the thickness range of about 0.01 µm to 1 µm.

The passivation film (not shown in the drawing) may be selected from a silicon nitride film, aluminum nitride film, a diamond-like carbon film, and other insulating films having high blocking abilities to moisture and oxygen.

Through the above steps, an active matrix substrate for an EL (electroluminescence) display device, in which a driver circuit 650 composed of an n-channel TFT 640 and a p-channel TFT 641, a pixel region 651 formed with a current controlling TFT 642 of a p-channel type, and a switching TFT 643 of n-channel type, are formed over the same substrate.

Further, a TFT according to Embodiment Mode 1 is applied to a TFT in this embodiment, however, it is not limited thereto; TFTs described in Embodiment Mode 2 may be applied alternatively.

Thus, an EL display device having a crystalline silicon film with fewer defects as an active layer can be fabricated by applying an active matrix substrate according to the present invention to an EL display device. Namely, a liquid crystal display device which provides high-speed performance with low voltage can be manufactured.

Embodiment 4

Figure 10A:
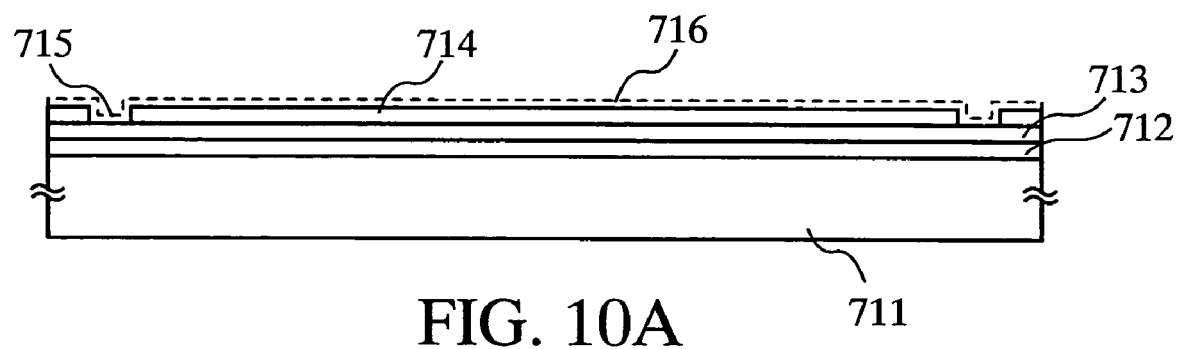
FIGS. 10A-10C show the steps of forming crystalline silicon films according to the present invention.
Figure 10B:
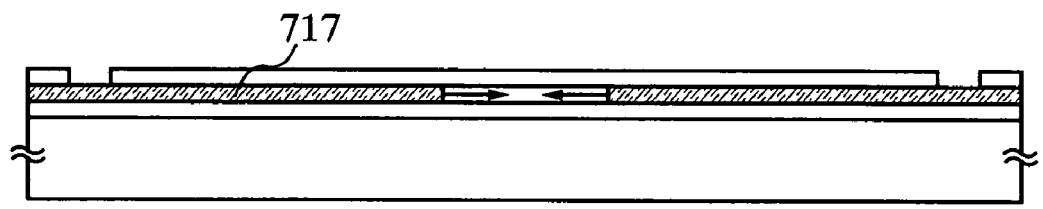
Figure 10C:
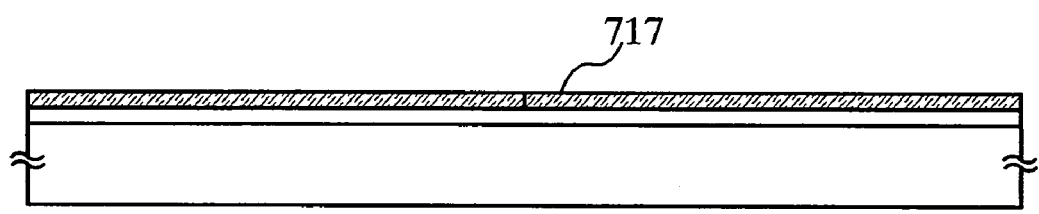

In this embodiment, an embodiment of a method for producing a crystalline silicon film in Embodiment 1 is described in reference to FIGS. 10A to 10C.

As shown in FIG. 10A, an insulating film 712 which functions as a blocking layer and an amorphous silicon film 713 are formed over a glass substrate 711 similarly to Embodiment 1. A silicon oxide film with a thickness of 100 nm is formed thereover using plasma CVD as a mask insulating film 914, and then an opening 715 is formed. Thereafter, a metal element for accelerating crystallization of the amorphous silicon film is added to the substrate. In this embodiment, an aqueous solution 716 containing 5 ppm of nickel acetate salt is spin coated for adding Ni as the metal element. The Ni contacts with the amorphous silicon film at the opening 715.

Then, as shown in FIG. 10B, after dehydrogenation by a heat treatment at 500° C. for one hour, the amorphous silicon film is crystallized through a heat treatment at 580° C. for 4 hours. The crystal grows in a direction parallel to a substrate surface from the opening 715 due to the effect of the metal element. A crystalline silicon film 717 formed in this manner comprises the mass of rod-like or needle-like crystals, and each of crystals grows in a particular direction macroscopically, therefore the film has uniform crystallinity. Moreover, there is a feature of high orientation ratio in a particular direction.

After the heat treatment is completed, the mask insulating film 714 is etched and removed, thereby obtaining a crystalline silicon film 717 as shown in FIG. 10C. Subsequently, the silicon film is irradiated with a first laser beam in a direction from the substrate to the silicon film: generally a pulsed laser beam emitted from an excimer laser, and the silicon film is irradiated with a second laser beam through the substrate in a direction from the silicon film to the substrate: generally, a pulsed laser beam emitted from a YAG laser thereafter. Thus, a crystalline silicon film having fewer defects as well as uniform crystallinity. Note that, a silicon film manufactured according to this embodiment can applied to Embodiments 1 to 3.

Embodiment 5

A TFT and an active matrix substrate according to the present invention can be applied to various modules (active matrix liquid crystal module, active matrix EL module). Thus, the present invention can be applied to all electronic devices incorporating these modules in display parts.

The following can be given as examples of such electronic devices: portable information terminals (electronic notebooks, mobile computers, or mobile phones and the like), video cameras, digital cameras, personal computers, TV sets, mobile phones, projectors, or the like. A projector incorporating an active matrix liquid crystal module is shown as an example in FIGS. 11A to 11D.

Figure 11A:
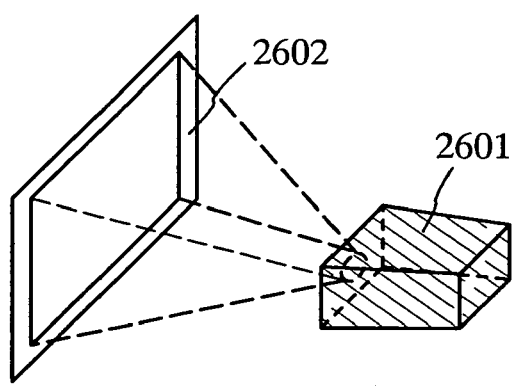
FIGS. 11A-11D show examples of electronic devices that can be manufactured according to the present invention.

FIG. 11A shows a projector, which includes a projection device 2601, a screen 2602, and the like.

Figure 11B:
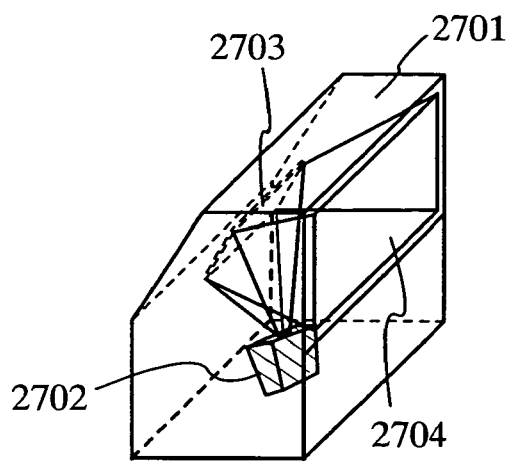

FIG. 11B shows a rear projector, which includes a main body 2701, a projection device 2702, a mirror 2703, a screen 2704, and the like.

Figure 11C:
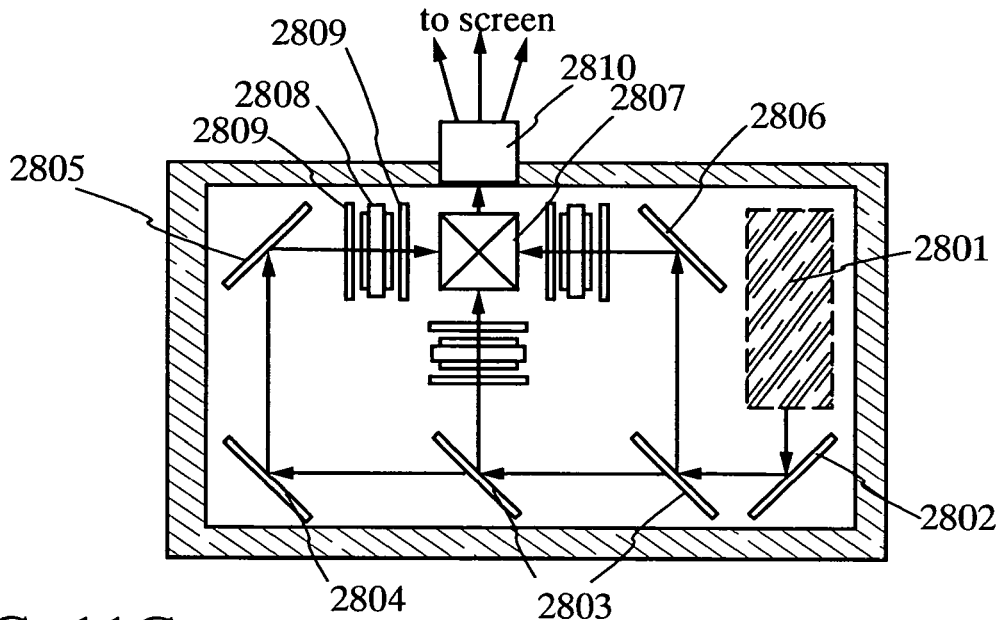

FIG. 11C is a diagram showing an example of the structure of the projection devices 2601 and 2702 in FIGS. 11A and 11B. Each of the projection devices 2601 and 2702 comprises a light source optical system 2801, mirrors 2802 and 2804 to 2806, a dichroic mirror 2803, a prism 2807, a liquid crystal display device 2808, a phase plate 2809, and a projection optical system 2810. The projection optical system 2810 is an optical system including a projection lens. Shown in this embodiment is a three-plate type, and there is no particular limitation. For example, it may be a single-plate type. An optical system such as an optical lens, a film having a polarizing function, a film for adjusting the phase difference, or an IR film may be provided in the light path indicated by the arrow in FIG. 11C, if necessary.

Figure 11D:
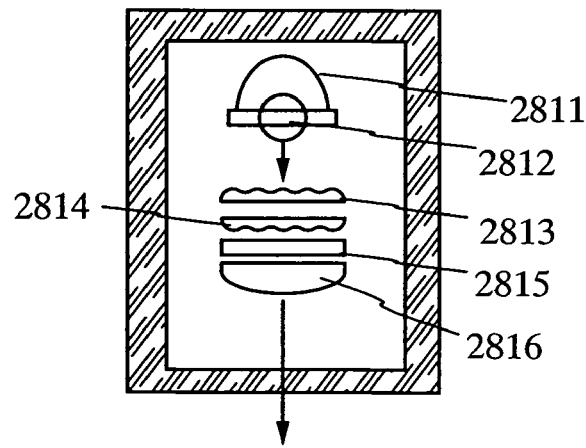

FIG. 11D is a diagram showing an example of the structure of the light source optical system 2801 in FIG. 11C. In this embodiment, the light source optical system 2801 includes a reflector 2811, a light source 2812, lens arrays 2813 and 2814, a polarization scrambler 2815, and a condenser lens 2816. The light source optical system shown in FIG. 11D is merely an example and is not to limit the present invention. For example, an optical system such as an optical lens, a film having a polarizing function, a film for adjusting the phase difference, or an IR film may be provided in the light source optical system, if necessary.

FIGS. 11A and 11B show a case where a transmissive active matrix liquid crystal module is used. Alternatively, a reflective active matrix liquid crystal module may be applied though the example is not shown here.

On an existing projector, there has been a problem that spots (pixels which remains glowing due to the malfunction of switching in a pixel TFT) arise when a TFT having a crystalline silicon film which is crystallized by using a metal element. One of the causes of the spots is thought to be an inefficient gettering of a metal element allowing off-current to flow more easily. The spots which leads to uneven display can be reduced by applying an active matrix liquid crystal module described in Embodiment 2 to the projectors described in this embodiment. Consequently, projectors which can provide high definition display can be manufactured. Further, the present invention makes it possible to manufacture projectors providing high speed performance by fabricating an active matrix liquid crystal module having a TFT in which defects are reduced in a crystalline silicon film.

Note that, devices illustrated here are only a few examples among many, and the applications are not limited thereto.

According to the present invention, crystal defects and the concentration of the metal element in semiconductor silicon film are reduced by irradiating the crystalline semiconductor film formed by solid phase epitaxy with a metal element with a first laser beam in a direction from the semiconductor film to a substrate, and irradiating the semiconductor film with a second laser through the substrate in a direction from the substrate to the semiconductor film. The first laser is generally a pulsed laser beam having a wavelength range from a visible region to a vacuum ultraviolet region, which is emitted from a gas laser, a solid-state laser, or a metal laser. Moreover, the second laser is generally a pulsed or continuous wave laser beam having a wavelength range from a visible region to a vacuum ultraviolet region, which is emitted from a gas laser, a solid-state laser, or a metal laser.

The present invention enables the crystal defects in a crystalline semiconductor device to decrease. Consequently, an S value of the semiconductor film is reduced and a TFT which operates at high-speed even with low voltage can be manufactured. Further, the present invention enables reduction in residual metal elements, which makes off-current decrease. Thus, a TFT with low power consumption can be fabricated. Namely, the electrical characteristics of a TFT manufactured using an existing technique can further be improved.

Furthermore, an electronic device which displays higher definition image can be obtained by applying a liquid crystal module or an EL module having an active matrix substrate manufactured according to the present invention to the display part.

What is claimed is:

1. A method of manufacturing a semiconductor device, comprising the steps of:

forming a crystalline semiconductor film containing a metal element over a transparent substrate;

irradiating a first region of the crystalline semiconductor film with a first laser beam in a direction from the crystalline semiconductor film to the substrate after forming the crystalline semiconductor film; and irradiating the first region of the crystalline semiconductor film with a second laser beam through the substrate in a direction from the substrate to the crystalline semiconductor film while irradiating a second region of the crystalline semiconductor film with the first laser beam, wherein the first region and the second region do not overlap each other.

2. A method of manufacturing a semiconductor device according to claim 1, wherein the first laser beam is a pulsed laser beam having a wavelength range from a visible region to a vacuum ultraviolet region, and the second laser beam is a pulsed or continuous wave laser beam having a wavelength range from a visible region to a vacuum ultraviolet region.

3. A method of manufacturing a semiconductor device according to claim 1, wherein each of the first and second laser beams is emitted from a laser selected from the group consisting of a gas laser, a solid-state laser, and a metal laser.

4. A method of manufacturing a semiconductor device according to claim 1, wherein the first laser beam is emitted from a laser selected from the group consisting of an excimer laser, a glass laser, a ruby laser, an alexandrite laser, a Ti: sapphire laser, a copper vapor laser, and a gold vapor laser.

5. A method of manufacturing a semiconductor device according to claim 4, wherein the excimer laser is selected from the group consisting of a XeCl excimer laser, a KrCl excimer laser, an ArF excimer laser, a KrF excimer laser, and a XeF excimer laser.

6. A method of manufacturing a semiconductor device according to claim 1, wherein the first laser beam is emitted from a laser selected from the group consisting of second, third, or fourth harmonics of a YAG laser, a YVO$_4$ laser, and a YLF laser.

7. A method of manufacturing a semiconductor device according to claim 1, wherein the second laser beam is emitted from a laser selected from the group consisting of an excimer laser, an Ar laser, a Kr laser, a glass laser, a ruby laser, an alexandrite laser, a Ti: sapphire laser, a He—Cd laser, a copper vapor laser, and a gold vapor laser.

8. A method of manufacturing a semiconductor device according to claim 7, wherein the excimer laser is selected from the group consisting of a XeCl excimer laser, a KrCl excimer laser, an ArF excimer laser, a KrF excimer laser, and a XeF excimer laser.

9. A method of manufacturing a semiconductor device according to claim 1, wherein the second laser beam is emitted from a laser selected from the group consisting of second, third, and fourth harmonics of a YAG laser, a YVO$_4$ laser, and a YLF laser.

10. A method of manufacturing a semiconductor device according to claim 1, wherein the step of forming the crystalline semiconductor film containing the metal element over the transparent substrate comprises:
    forming an amorphous semiconductor film over the transparent substrate;
    adding the metal element to the amorphous semiconductor film; and
    heating the amorphous semiconductor film to form the crystalline semiconductor film after adding the metal element.

11. A method of manufacturing a semiconductor device according to claim 1 further comprising a step of:
    gettering the metal element after irradiating the second laser beam.

12. A method of manufacturing a semiconductor device according to claim 1 further comprising steps of:
    forming a gettering site over the crystalline semiconductor film after irradiating the second laser beam; and
    reducing the metal element contained in the crystalline semiconductor film by heating the crystalline semiconductor film and the gettering site.

13. A method of manufacturing a semiconductor device, comprising the steps of:
    forming an amorphous semiconductor film over a transparent substrate;
    adding a metal element to the amorphous semiconductor film followed by heating thereby forming a crystalline semiconductor film after forming the amorphous semiconductor film;
    irradiating a first region of the crystalline semiconductor film with a first laser beam in a direction from the crystalline semiconductor film to the substrate, thereby melting and crystallizing the crystalline semiconductor film after adding the metal element; and
    irradiating the first region of the crystalline semiconductor film with a second laser beam through the substrate in a direction from the substrate to the crystalline semiconductor film while irradiating a second region of the crystalline semiconductor film with the first laser beam thereby melting and crystallizing the crystalline semiconductor film wherein the first region and the second region do not overlap each other.

14. A method of manufacturing a semiconductor device according to claim 13, wherein the first laser beam is a pulsed laser beam having a wavelength range from a visible region to a vacuum ultraviolet region, and the second laser beam is a pulsed or continuous wave laser beam having a wavelength range from a visible region to a vacuum ultraviolet region.

15. A method of manufacturing a semiconductor device according to claim 13, wherein each of the first and second laser beams is emitted from a laser selected from the group consisting of a gas laser, a solid-state laser, and a metal laser.

16. A method of manufacturing a semiconductor device according to claim 13, wherein the first laser beam is emitted from a laser selected from the group consisting of an excimer laser, a glass laser, a ruby laser, an alexandrite laser, a Ti: sapphire laser, a copper vapor laser, and a gold vapor laser.

17. A method of manufacturing a semiconductor device according to claim 13, wherein the excimer laser is selected from the group consisting of a XeCl excimer laser, a KrCl excimer laser, an ArF excimer laser, a KrF excimer laser, and a XeF excimer laser.

18. A method of manufacturing a semiconductor device according to claim 13, wherein the first laser beam is emitted from a laser selected from the group consisting of second, third, or fourth harmonics of a YAG laser, a YVO$_4$ laser, and a YLF laser.

19. A method of manufacturing a semiconductor device according to claim 13, wherein the second laser beam is emitted from a laser selected from the group consisting of an excimer laser, an Ar laser, a Kr laser, a glass laser, a ruby laser, an alexandrite laser, a Ti: sapphire laser, a He—Cd laser, a copper vapor laser, and a gold vapor laser.

20. A method of manufacturing a semiconductor device according to claim 19, wherein the excimer laser is selected from the group consisting of a XeCl excimer laser, a KrCl excimer laser, an ArF excimer laser, a KrF excimer laser, and a XeF excimer laser.

21. A method of manufacturing a semiconductor device according to claim 13, wherein the second laser beam is emitted from a laser selected from the group consisting of second, third, or fourth harmonics of a YAG laser, a YVO$_4$ laser, and a YLF laser.

22. A method of manufacturing a semiconductor device, comprising the steps of:
    forming an amorphous semiconductor film over a transparent substrate;
    adding a metal element to the amorphous semiconductor film followed by beating thereby forming a crystalline semiconductor film after forming the amorphous semiconductor film;
    irradiating a first region of the crystalline semiconductor film with a first laser beam in a direction from the crystalline semiconductor film to the substrate, thereby melting and crystallizing the crystalline semiconductor film after adding the metal element and
    irradiating the first region of the crystalline semiconductor film with a second laser beam through the substrate in a direction from the substrate to the crystalline semiconductor film while irradiating a second region of the crystalline semiconductor film with the first laser beam, thereby reducing defects in the crystalline semiconductor film;

wherein the first region and the second region do not overlap each other.

23. A method of manufacturing a semiconductor device according to claim 22, wherein the first laser beam is a pulsed laser beam having a wavelength range from a visible region to a vacuum ultraviolet region, and the second laser beam is a pulsed or continuous wave laser beam having a wavelength range from a visible region to a vacuum ultraviolet region.

24. A method of manufacturing a semiconductor device according to claim 22, wherein each of the first and second laser beams is emitted from a laser selected from the group consisting of a gas laser, a solid-state laser, and a metal laser.

25. A method of manufacturing a semiconductor device according to claim 22, wherein the first laser beam is emitted from a laser selected from the group consisting of an excimer laser, a glass laser, a ruby laser, an alexandrite laser, a Ti: sapphire laser, a copper vapor laser, and a gold vapor laser.

26. A method of manufacturing a semiconductor device according to claim 25, wherein the excimer laser is selected from the group consisting of a XeCl excimer laser, a KrCl excimer laser, an ArF excimer laser, a KrF excimer laser, and a XeF excimer laser.

27. A method of manufacturing a semiconductor device according to claim 22, wherein the first laser beam is emitted from a laser selected from the group consisting of second, third, or fourth harmonics of a YAG laser, a YVO$_4$ laser and a YLF laser.

28. A method of manufacturing a semiconductor device according to claim 22, wherein the second laser beam is emitted from a laser selected from the group consisting of an excimer laser, an Ar laser, a Kr laser, a glass laser, a ruby laser, an alexandrite laser, a Ti: sapphire laser, a He—Cd laser, a copper vapor laser, and a gold vapor laser.

29. A method of manufacturing a semiconductor device according to claim 28, wherein the excimer laser is selected from the group consisting of a XeCl excimer laser, a KrCl excimer laser, an ArF excimer laser, a KrF excimer laser, and a XeF excimer laser.

30. A method of manufacturing a semiconductor device according to claim 22, wherein the second laser beam is emitted from a laser selected from the group consisting of second, third, and fourth harmonics of a YAG laser, a YVO$_4$ laser, and a YLF laser.

31. A method of manufacturing a semiconductor device, comprising the steps of:
    forming an amorphous semiconductor film over a transparent substrate;
    adding a metal element to the amorphous semiconductor film followed by heating thereby forming a crystalline semiconductor film after forming the amorphous semiconductor film;
    irradiating a first region of the crystalline semiconductor film with a first laser beam in a direction from the crystalline semiconductor film to the substrate after adding the metal element; and
    irradiating the first region of the crystalline semiconductor film with a second laser beam through the substrate in a direction from the substrate to the crystalline semiconductor film while irradiating a second region of the crystalline semiconductor film with the first laser beam,
    wherein the first region and the second region do not overlap each other.

32. A method of manufacturing a semiconductor device according to claim 31, wherein the first laser beam is a pulsed laser beam having a wavelength range from a visible region to a vacuum ultraviolet region, and the second laser beam is a pulsed or continuous wave laser beam having a wavelength range from a visible region to a vacuum ultraviolet region.

33. A method of manufacturing a semiconductor device according to claim 31, wherein each of the first and second laser beams is emitted from a laser selected from the group consisting of a gas laser, a solid-state laser, and a metal laser.

34. A method of manufacturing a semiconductor device according to claim 31, wherein the first laser beam is emitted from a laser selected from the group consisting of an excimer laser, a glass laser, a ruby laser, an alexandrite laser, a Ti: sapphire laser, a copper vapor laser, and a gold vapor laser.

35. A method of manufacturing a semiconductor device according to claim 34, wherein the excimer laser is selected from the group consisting of a XeCl excimer laser, a KrCl excimer laser, an ArF excimer laser, a KrF excimer laser, and a XeF excimer laser.

36. A method of manufacturing a semiconductor device according to claim 31, wherein the first laser beam is emitted from a laser selected from the group consisting of second, third, and fourth harmonics of a YAG laser, a YVO$_4$ laser, and a YLF laser.

37. A method of manufacturing a semiconductor device according to claim 31, wherein the second laser beam is emitted from a laser selected from the group consisting of an excimer laser, an Ar laser, a Kr laser, a glass laser, a ruby laser, an alexandrite laser, a Ti: sapphire laser, a He—Cd laser, a copper vapor laser, and a gold vapor laser.

38. A method of manufacturing a semiconductor device according to claim 37, wherein the excimer laser is selected from the group consisting of a XeCl excimer laser, a KrCl excimer laser, an ArF excimer laser, a KrF excimer laser, and a XeF excimer laser.

39. A method of manufacturing a semiconductor device according to claim 31, wherein the second laser beam is emitted from a laser selected from the group consisting of second, third, and fourth harmonics of a YAG laser, a YVO$_4$ laser, and a YLF laser.

40. A method of manufacturing a semiconductor device, comprising the steps of:
    forming a crystalline semiconductor film containing a metal element over a transparent substrate;
    irradiating a first region of the crystalline semiconductor film with a first laser beam in a direction from the crystalline semiconductor film to the substrate after forming the crystalline semiconductor film, thereby melting and crystallizing the crystalline semiconductor film; and
    irradiating the first region of the crystalline semiconductor film with a second laser beam through to substrate in a direction from the substrate to the crystalline semiconductor film while irradiating a second region of the crystalline semiconductor film with the first laser beam, thereby melting and crystallizing the crystalline semiconductor film,
    wherein the first region and the second region do not overlap each other.

41. A method of manufacturing a semiconductor device according to claim 40, wherein the first laser beam is a pulsed laser beam having a wavelength range from a visible region to a vacuum ultraviolet region, and the second laser beam is a pulsed or continuous wave laser beam having a wavelength range from a visible region to a vacuum ultraviolet region.

42. A method of manufacturing a semiconductor device according to claim 40, wherein each of the first and second laser beams is emitted from a laser selected from the group consisting of a gas laser, a solid-state laser, and a metal laser.

43. A method of manufacturing a semiconductor device according to claim 40, wherein the first laser beam is emitted from a laser selected from the group consisting of an excimer laser, a glass laser, a ruby laser, an alexandrite laser, a Ti: sapphire laser, a copper vapor laser, and a gold vapor laser.

44. A method of manufacturing a semiconductor device according to claim 43, wherein the excimer laser is selected from the group consisting of a XeCl excimer laser, a KrCl excimer laser, an ArF excimer laser, a KrF excimer laser, and a XeF excimer laser.

45. A method of manufacturing a semiconductor device according to claim 40, wherein the first laser beam is emitted from a laser selected from the group consisting of second, third, or fourth harmonics of a YAG laser, a $YVO_4$ laser, and a YLF laser.

46. A method of manufacturing a semiconductor device according to claim 40, wherein the second laser beam is emitted from a laser selected from the group consisting of an excimer laser, an Ar laser, a Kr laser, a glass laser, a ruby laser, an alexandrite laser, a Ti: sapphire laser, a He—Cd laser, a copper vapor laser, and a gold vapor laser.

47. A method of manufacturing a semiconductor device according to claim 46, wherein the excimer laser is selected from the group consisting of a XeCl excimer laser, a KrCl excimer laser, an ArF exchanger laser, a KrF excimer laser, and a XeF excimer laser.

48. A method of manufacturing a semiconductor device according to claim 40, wherein the second laser beam is emitted from a laser selected from the group consisting of second, third, or fourth harmonics of a YAG laser, a $YVO_4$ laser, and a YLF laser.

49. A method of manufacturing a semiconductor device according to claim 40, wherein the step of forming the crystalline semiconductor film containing the metal element over the transparent substrate comprises:
  forming an amorphous semiconductor film over the transparent substrate;
  adding the metal element to the amorphous semiconductor film; and
  heating the amorphous semiconductor film to form the crystalline semiconductor film after adding the metal element.

50. A method of manufacturing a semiconductor device according to claim 40 further comprising a step of:
  gettering the metal element after irradiating the second laser beam.

51. A method of manufacturing a semiconductor device according to claim 40 further comprising steps of:
  forming a gettering site over the crystalline semiconductor film after irradiating the second laser beam; and
  reducing the metal element contained in the crystalline semiconductor film by heating the crystalline semiconductor film and the gettering site.

52. A method of manufacturing a semiconductor device, comprising the steps of:
  forming a crystalline semiconductor film containing a metal element over a transparent substrate;
  irradiating a first region of the crystalline semiconductor film with a first laser beam in a direction from the crystalline semiconductor film to the substrate after forming the crystalline semiconductor film, thereby melting and crystallizing the crystalline semiconductor film; and
  irradiating the first region of the crystalline semiconductor film with a second laser beam through the substrate in a direction from the substrate to the crystalline semiconductor film while irradiating a second region of the crystalline semiconductor film with the first laser beam to reduce defects in the crystalline semiconductor film,
  wherein the first region and the second region do not overlap each other.

53. A method of manufacturing a semiconductor device according to claim 52, wherein the first laser beam is a pulsed laser beam having a wavelength range from a visible region to a vacuum ultraviolet region, and the second laser beam is a pulsed or continuous wave laser beam having a wavelength range from a visible region to a vacuum ultraviolet region.

54. A method of manufacturing a semiconductor device according to claim 52, wherein each of the first and second laser beams is emitted from a laser selected from the group consisting of a gas laser, a solid-state laser, and a metal laser.

55. A method of manufacturing a semiconductor device according to claim 52, wherein the first laser beam is emitted from a laser selected from the group consisting of an excimer laser, a glass laser, a ruby laser, an alexandrite laser, a Ti: sapphire laser, a copper vapor laser, and a gold vapor laser.

56. A method of manufacturing a semiconductor device according to claim 55, wherein the excimer laser is selected from the group consisting of a XeCl excimer laser, a KrCl excimer laser, an ArF excimer laser, a KrF excimer laser, and a XeF excimer laser.

57. A method of manufacturing a semiconductor device according to claim 52, wherein the first laser beam is emitted from a laser selected from the group consisting of second, third, or fourth harmonics of a YAG laser, a $YVO_4$ laser, and a YLF laser.

58. A method of manufacturing a semiconductor device according to claim 52, wherein the second laser beam is emitted from a laser selected from the group consisting of an excimer laser, an Ar laser, a Kr laser, a glass laser, a ruby laser, an alexandrite laser, a Ti: sapphire laser, a He—Cd laser, a copper vapor laser, and a gold vapor laser.

59. A method of manufacturing a semiconductor device according to claim 58, wherein the excimer laser is selected from the group consisting of a XeCl excimer laser, a KrCl excimer laser, an ArF excimer laser, a KrF excimer laser, and a XeF excimer laser.

60. A method of manufacturing a semiconductor device according to claim 52, wherein the second laser beam is emitted from a laser selected from the group consisting of second, third, and fourth harmonics of a YAG laser, a $YVO_4$ laser, and a YLF laser.

61. A method of manufacturing a semiconductor device according to claim 52, wherein the step of forming the crystalline semiconductor film containing the metal element over the transparent substrate comprises:
  forming an amorphous semiconductor film over the transparent substrate;
  adding the metal element to the amorphous semiconductor film; and
  heating the amorphous semiconductor film to form the crystalline semiconductor film after adding the metal element.

62. A method of manufacturing a semiconductor device according to claim 52 further comprising a step of:
  gettering the metal element after irradiating the second laser beam.

63. A method of manufacturing a semiconductor device according to claim 52 further comprising steps of:
  forming a gettering site over the crystalline semiconductor film after irradiating the second laser beam; and
  reducing the metal element contained in the crystalline semiconductor film by heating the crystalline semiconductor film and the gettering site.

64. A method of manufacturing a semiconductor device, comprising the steps of:
  forming a crystalline semiconductor film containing a metal element over a transparent substrate;
  irradiating a first region of the crystalline semiconductor film with a first laser beam in a direction from the crystalline semiconductor film to the substrate after forming the crystalline semiconductor film; and
  irradiating the first region of the crystalline semiconductor film with a second laser beam through the substrate in a direction from the substrate to the crystalline semiconductor film while irradiating a second region of the crystalline semiconductor film with the first laser beam to segregate the metal element to defects in the crystalline semiconductor film,
  wherein the first region and the second region do not overlap each other.

65. A method of manufacturing a semiconductor device according to claim 64, wherein the first laser beam is a pulsed laser beam having a wavelength range from a visible region to a vacuum ultraviolet region, and the second laser beam is a pulsed or continuous wave laser beam having a wavelength range from a visible region to a vacuum ultraviolet region.

66. A method of manufacturing a semiconductor device according to claim 64, wherein each of the first and second laser beams is emitted from a laser selected from the group consisting of a gas laser, a solid-state laser, and a metal laser.

67. A method of manufacturing a semiconductor device according to claim 64, wherein the first laser beam is emitted from a laser selected from the group consisting of an excimer laser, a glass laser, a ruby laser, an alexandrite laser, a Ti: sapphire laser, a copper vapor laser, and a gold vapor laser.

68. A method of manufacturing a semiconductor device according to claim 67, wherein the excimer laser is selected from the group consisting of a XeCl excimer laser, a KrCl excimer laser, an ArF excimer laser, a KrF excimer laser, and a XeF excimer laser.

69. A method of manufacturing a semiconductor device according to claim 64, wherein the first laser beam is emitted from a laser selected from the group consisting of second, third, or fourth harmonics of a YAG laser, a $YVO_4$ laser, and a YLF laser.

70. A method of manufacturing a semiconductor device according to claim 64, wherein the second laser beam is emitted from a laser selected from the group consisting of an excimer laser, an Ar laser, a Kr laser, a glass laser, a ruby laser, an alexandrite laser, a Ti: sapphire laser, a He—Cd laser, a copper vapor laser, and a gold vapor laser.

71. A method of manufacturing a semiconductor device according to claim 70, wherein the excimer laser is selected from the group consisting of a XeCl excimer laser, a KrCl excimer laser, an ArF excimer laser, a KrF excimer laser, and a XeF excimer laser.

72. A method of manufacturing a semiconductor device according to claim 64, wherein the second laser beam is emitted from a laser selected from the group consisting of second, third, and fourth harmonics of a YAG laser, a $YVO_4$ laser, and a YLF laser.

73. A method of manufacturing a semiconductor device according to claim 64 further comprising steps of:
  forming a gettering site over the crystalline semiconductor film after irradiating the second laser beam; and
  reducing the metal element contained in the crystalline semiconductor film by heating the crystalline semiconductor film and the gettering site.

* * * * *